US006798068B2

(12) United States Patent
Oglesby

(10) Patent No.: US 6,798,068 B2
(45) Date of Patent: Sep. 28, 2004

(54) MOCVD FORMATION OF $CU_2S$

(75) Inventor: Jane V. Oglesby, Mountain View, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 10/305,889

(22) Filed: Nov. 26, 2002

(65) Prior Publication Data

US 2004/0102038 A1 May 27, 2004

(51) Int. Cl.[7] .......................... H01L 23/48; H01L 23/52; H01L 29/40
(52) U.S. Cl. ...................................... 257/759; 257/744
(58) Field of Search ............................... 257/759, 758, 257/744, 745, 762, 642, 643

(56) References Cited

U.S. PATENT DOCUMENTS

| | | | | |
|---|---|---|---|---|
| 5,281,304 | A | * | 1/1994 | Kadomura .................. 156/656 |
| 5,350,484 | A | * | 9/1994 | Gardner et al. ............. 156/628 |
| 5,393,675 | A | * | 2/1995 | Compaan .................... 136/260 |
| 5,492,832 | A | * | 2/1996 | Shirazi ........................ 436/55 |
| 5,840,897 | A | | 11/1998 | Kirlin et al. |
| 6,211,043 | B1 | | 4/2001 | Nishio et al. |
| 6,429,117 | B1 | * | 8/2002 | Sudijono et al. ............ 438/627 |

FOREIGN PATENT DOCUMENTS

JP       62 095882 A    5/1987

OTHER PUBLICATIONS

International Search Report, PCT/US03/21669, mailed Jan. 23, 2004.
Rumyantsev M. Yu, et al., RPECVD Thin Cadmium, Copper and Zinc Sulphide Films, 1999, pp. 777–784, Institute of Inorganic Chemistry, SB RAS, Novosibirsk–90, Russia.

* cited by examiner

Primary Examiner—David Nhu
(74) Attorney, Agent, or Firm—Amin & Turocy, LLP

(57) ABSTRACT

A system and methodology are disclosed for forming a passive layer on a conductive layer. The formation can be done during fabrication of an organic memory cell, where the passive layer generally includes a conductivity facilitating compound, such as copper sulfide ($Cu_2S$). The conductivity facilitating compound is deposited onto the conductive layer via plasma enhanced chemical vapor deposition (PECVD) utilizing a metal organic (MO) precursor. The precursor facilitates depositing the conductivity facilitating compound in the absence of toxic hydrogen sulfide ($H_2S$), and at a relatively low temperature and pressure (e.g., between about 400 to 600 K and 0.05 to 0.5 Pa., respectively). The deposition process can be monitored and controlled to facilitate, among other things, depositing the conductivity facilitating compound to a desired thickness.

16 Claims, 15 Drawing Sheets

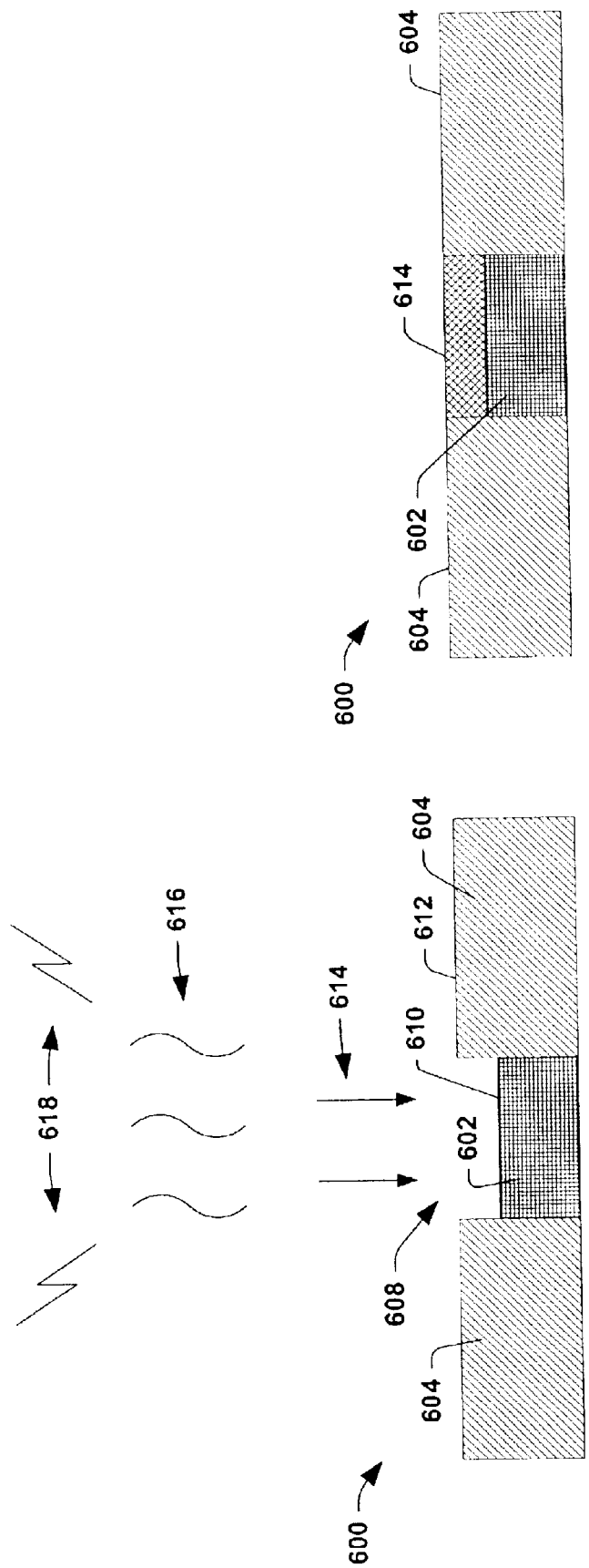

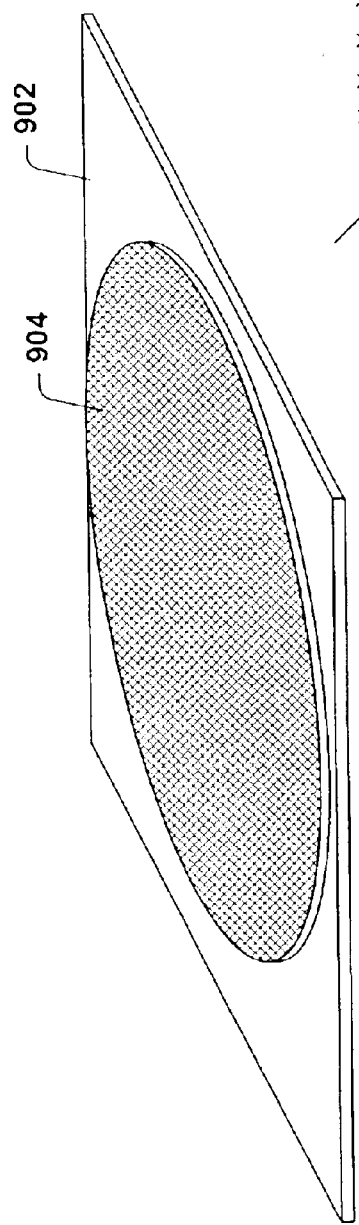
Fig. 9
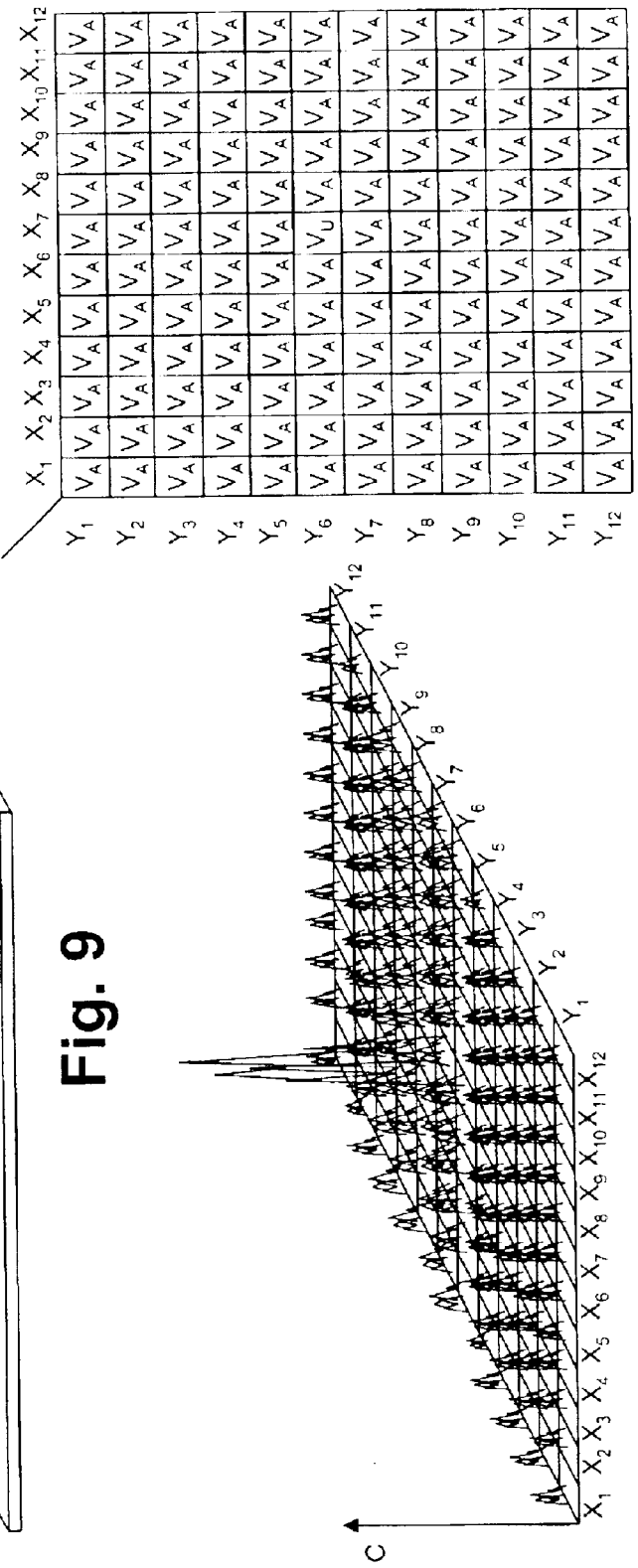
Fig. 11
Fig. 10

MOCVD FORMATION OF CU₂S

FIELD OF INVENTION

The present invention relates generally semiconductor fabrication and, in particular, to a system and methodology for forming a conductivity facilitating layer via chemical vapor deposition (CVD) utilizing a metal organic (MO) precursor.

BACKGROUND OF THE INVENTION

In the semiconductor industry there is a continuing trend toward increasing device densities, throughput and yield. To increase device densities there have been, and continue to be, efforts toward scaling down semiconductor device dimensions (e.g., at sub-micron levels). In order to accomplish such densities, smaller feature sizes and more precise feature shapes are required. This may include the width and spacing of interconnecting lines, spacing and diameter of contact holes, and the surface geometry, such as corners and edges, of various features. To increase throughput, the number of required processing steps can be reduced and/or the time required for those processing steps can be reduced. To increase yield, which is the percentage of finished products that leave a fabrication process as compared to the number of products that enter the fabrication process, control and/or quality of individual fabrication processes can be improved.

Semiconductor fabrication is a manufacturing process employed to create semiconductor devices in and on a wafer surface. Polished, blank wafers come into semiconductor fabrication, and exit with the surface covered with large numbers of semiconductor devices. Semiconductor fabrication includes a large number of steps and/or processes that control and build the devices—basic processes utilized include layering, doping, heat treatments and patterning. Layering is an operation that adds thin layers to the wafer surface. Layers can be, for example, insulators, semiconductors and/or conductors and are grown or deposited via a variety of processes. Common deposition techniques include, for example, evaporation and sputtering. Doping is a process that adds specific amounts of dopants to the wafer surface. The dopants can cause the properties of layers to be modified (e.g., change a semiconductor to a conductor). A number of techniques, such as thermal diffusion and ion implantation can be employed for doping. Heat treatments are another basic operation in which a wafer is heated and cooled to achieve specific results. Typically, in heat treatment operations, no additional material is added or removed from the wafer, although contaminates and vapors may evaporate from the wafer. One common heat treatment is annealing, which repairs damage to crystal structure of a wafer/device generally caused by doping operations. Other heat treatments, such as alloying and driving of solvents, are also employed in semiconductor fabrication.

The volume, use and complexity of computers and electronic devices are continually increasing as computers are consistently becoming more powerful and new and improved electronic devices are continually developed (e.g., digital audio players, video players). Additionally, the growth and use of digital media (e.g., digital audio, video, images, and the like) have further pushed development of these devices. Such growth and development has vastly increased the amount of information desired/required to be stored and maintained for computer and electronic devices.

Generally, information is stored and maintained in one or more of a number of types of storage devices. Storage devices include long term storage mediums such as, for example, hard disk drives, compact disk drives and corresponding media, digital video disk (DVD) drives, and the like. The long term storage mediums typically store larger amounts of information at a lower cost, but are slower than other types of storage devices. Storage devices also include memory cells which are often, but not always, short term storage mediums. Short term memory cells tend to be substantially faster than long term storage mediums. Such short term memory cells include, for example, dynamic random access memory (DRAM), static random access memory (SRAM), double data rate memory (DDR), fast page mode dynamic random access memory (FPMDRAM), extended data-out dynamic random access memory (EDODRAM), synchronous dynamic random access memory (SDRAM), VideoRAM (VRAM), flash memory, read only memory (ROM), and the like.

Memory cells can generally be subdivided into volatile and non-volatile types. Volatile memory cells usually lose their information if they lose power and typically require periodic refresh cycles to maintain their information. Volatile memory cells include, for example, random access memory (RAM), DRAM, SRAM and the like. Non-volatile memory cells maintain their information whether or not power is maintained to the devices. Non-volatile memory cells include, but are not limited to, ROM, programmable read only memory (PROM), erasable programmable read only memory (EPROM), electrically erasable programmable read only memory (EEPROM), flash EEPROM the like. Volatile memory cells generally provide faster operation at a lower cost as compared to non-volatile memory cells.

Memory cells often include arrays of memory cells. Each memory cell can be accessed or "read", "written", and "erased" with information. The memory cells maintain information in an "off" or an "on" state, also referred to as "0" and "1". Typically, a memory cell is addressed to retrieve a specified number of byte(s) (e.g., 8 memory cells per byte). For volatile memory cells, the memory cells must be periodically "refreshed" in order to maintain their state. Such memory cells are usually fabricated from semiconductor devices that perform these various functions and are capable of switching and maintaining the two states. The devices are often fabricated with inorganic solid state technology, such as, crystalline silicon devices. A common semiconductor device employed in memory cells is the metal oxide semiconductor field effect transistor (MOSFET).

The proliferation and increased usage of portable computer and electronic devices has greatly increased demand for memory cells. Digital cameras, digital audio players, personal digital assistants, and the like generally seek to employ large capacity memory cells (e.g., flash memory, smart media, compact flash, . . . ). The increased demand for information storage is commensurate with memory cells having an ever increasing storage capacity (e.g., increase storage per die or chip). A postage-stamp-sized piece of silicon may, for example, contain tens of millions of transistors, each transistor as small as a few hundred nanometers. However, silicon-based devices are approaching their fundamental physical size limits. Inorganic solid state devices are generally encumbered with a complex architecture which leads to high cost and a loss of data storage density. The volatile semiconductor memories based on inorganic semiconductor material require a near constant supply of electric current, which produces heating and high electric power consumption in order to merely maintain stored information. Non-volatile semiconductor memory cells, which are also based on inorganic semiconductor material, do not require such constant supplies of power in order to maintain stored information. However, non-volatile semiconductor memory cells have a reduced data rate, high power consumption and a large degree of complexity as compared with typical volatile memory cells.

Further, as the size of inorganic solid state devices decreases and integration increases, sensitivity to alignment tolerances can also increase making fabrication markedly more difficult. Formation of features at small minimum sizes does not imply that the minimum size can be used for fabrication of working circuits. It is necessary to have alignment tolerances which are much smaller than the minimum size, such as one quarter the minimum size, for example. Thus, further device shrinking and density increasing may be limited for inorganic memory cells. Furthermore, such shrinkage for inorganic non-volatile memory cells, while meeting increased performance demands, is particularly difficult to do while maintaining low costs.

A promising, relatively recent type of memory cell is an organic based memory cell. Organic memory cells are at least partly based on organic materials and, are thus able to overcome some of the limitations of inorganic based memory cells. Organic memory cells facilitate increases in device density while also increasing device performance relative to conventional inorganic memory cell. Additionally, organic memory cells are non-volatile and, as such, do not require frequent refresh cycles or constant power. The cells of the organic memory cell can have two or more states corresponding to various levels of impedance. These states are set by applying a bias voltage and then the cells remain in their respective states until another voltage, in reverse bias, is applied. The cells maintain their states with or without power (e.g., non-volatile) and can be read either electrically or optically by measuring injection current or light emission, for example.

SUMMARY OF THE INVENTION

The following presents a simplified summary of the invention in order to provide a basic understanding of some aspects of the invention. This summary is not an extensive overview of the invention. It is intended to neither identify key or critical elements of the invention nor delineate the scope of the invention. Its purpose is merely to present some concepts of the invention in a simplified form as a prelude to the more detailed description that is presented later.

According to one or more aspects of the present invention, a system and methodology for forming a passive layer on a conductive layer, such as can be done during fabrication of an organic memory cell, are disclosed. The passive layer generally includes a conductivity facilitating compound, such as copper sulfide ($Cu_2S$), and is deposited onto the conductive layer via plasma enhanced chemical vapor deposition (PECVD) utilizing a metal organic (MO) precursor. The precursor facilitates depositing the conductivity facilitating compound in the absence of toxic hydrogen sulfide ($H_2S$), and at a relatively low temperature and pressure (e.g., between about 473 to 573 K and 0.2 Pa., respectively). The deposition process can be monitored and controlled to facilitate, among other things, depositing the conductivity facilitating compound to a desired thickness.

To the accomplishment of the foregoing and related ends, certain illustrative aspects of the invention are described herein in connection with the following description and the annexed drawings. These aspects are indicative, however, of but a few of the various ways in which the principles of the invention may be employed and the present invention is intended to include all such aspects and their equivalents. Other advantages and novel features of the invention will become apparent from the following detailed description of the invention when considered in conjunction with the drawings.

BRIEF DESCRIPTION OF THE DRAWINGS

The present invention is illustrated by way of example in the accompanying figures.

FIG. 6 is another schematic cross sectional illustration of a portion of a conductive layer (surrounded by ILD) whereon copper sulfide can be deposited in forming a memory cell in accordance with one or more aspects of the present invention.

FIG. 7 is another schematic cross sectional illustration of a portion of a conductive layer (surrounded by ILD) whereon copper sulfide has been deposited via a plasma enhanced chemical vapor deposition process (PECVD) in forming a memory cell in accordance with one or more aspects of the present invention.

FIG. 9 illustrates a perspective view of a grid mapped wafer according to one or more aspects of the present invention.

FIG. 10 illustrates plots of measurements taken at grid mapped locations on a wafer in accordance with one or more aspects of the present invention.

FIG. 11 illustrates a table containing entries corresponding to measurements taken at respective at grid mapped locations on a wafer in accordance with one or more aspects of the present invention.

DETAILED DESCRIPTION OF THE INVENTION

Figure 1:
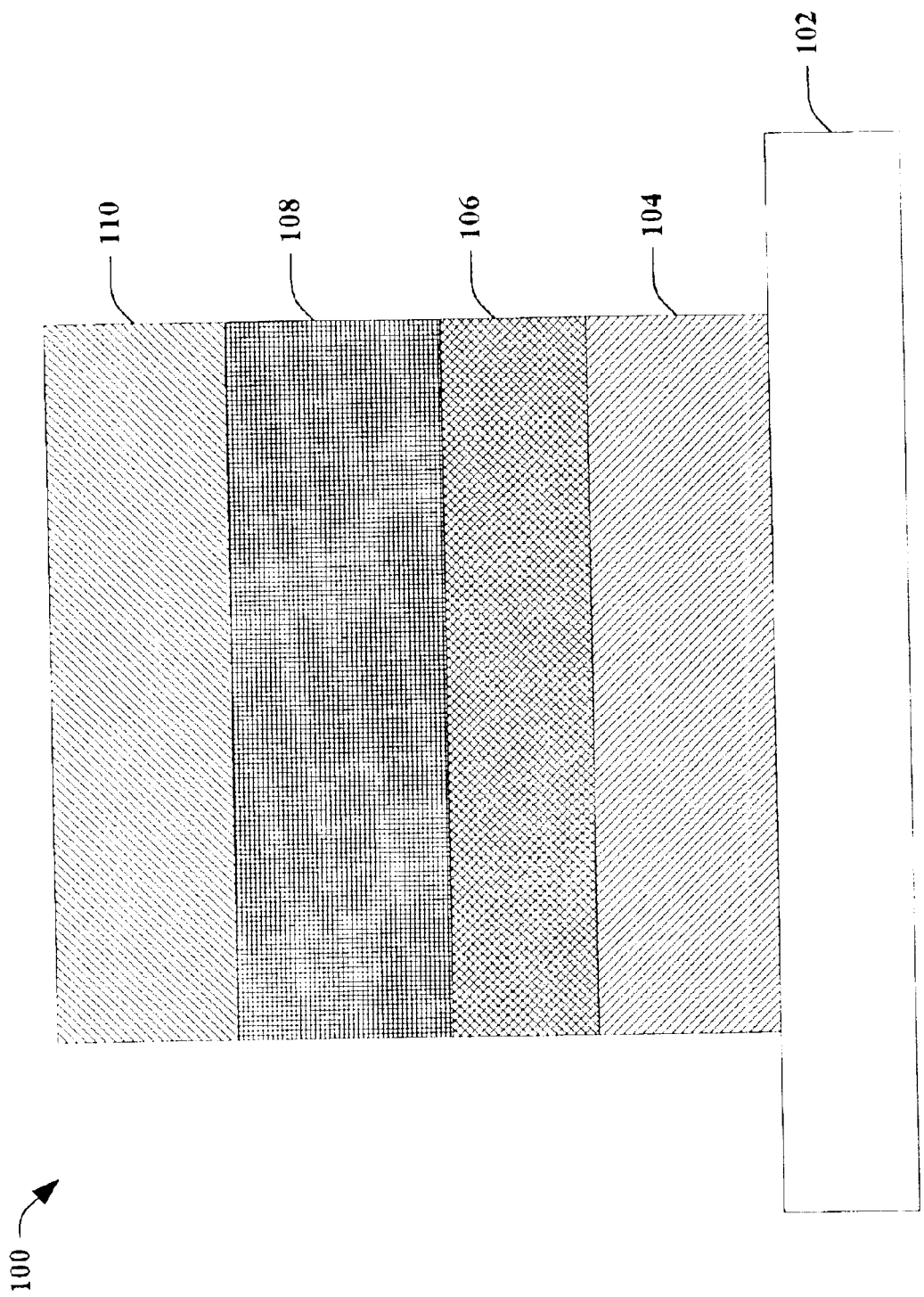
FIG. 1 is a schematic cross sectional illustration of a portion of a wafer depicting a memory cell formed thereon, a portion of which can be formed in accordance with one or more aspects of the present invention.

The present invention is now described with reference to the drawings, wherein like reference numerals are used to refer to like elements throughout. In the following description, for purposes of explanation, numerous specific details are set forth in order to provide a thorough understanding of the present invention. It may be evident, however, to one skilled in the art that one or more aspects of the present invention may be practiced with a lesser degree of these specific details. In other instances, known structures and devices may be shown in block diagram form in order to facilitate describing one or more aspects of the present invention.

FIG. 1 is a cross sectional illustration of an organic memory cell 100, a portion of which can be formed according to one or more aspects of the present invention. The memory cell 100 can be formed on a wafer typically on a base substrate 102, such as silicon. The cell 100 includes a bottom electrode 104, a passive layer 106, a polymer layer 108, and a top electrode 110. The organic memory cell 100 is capable of maintaining two or more states unlike conventional inorganic memory cells which maintain only two states. Thus, a single cell of the organic memory cell 100 can hold one or more bits of information. Furthermore, the organic memory cell 100 is a non-volatile memory cell and consequently, does not require a constant or nearly constant power supply.

The bottom electrode 104 is formed by depositing a first conductive material over the substrate 102. Trenches and/or vias can be formed in the substrate prior to deposition of the conductive material followed by selectively depositing the first conductive material into the trenches. The first conductive material is comprised of a conductive material, such as copper, aluminum, chromium, germanium, gold, magnesium, manganese, indium, iron, nickel, palladium, platinum, silver, titanium, zinc, alloys thereof, indium-tin oxide, polysilicon, doped amorphous silicon, metal silicides, and the like. Exemplary alloys that can be utilized for the conductive material include Hastelloy®, Kovar®, Invar, Monel®, Inconel®, brass, stainless steel, magnesium-silver alloy, and various other alloys.

The passive layer 106 is formed on the bottom electrode 104. The passive layer 106 contains at least one conductivity facilitating compound that has the ability to donate and accept charges (holes and/or electrons). Generally, the conductivity facilitating compound has at least two relatively stable oxidation-reduction states which permit the conductivity facilitating compound to donate and accept charges. According to one or more aspects of the present invention, the passive layer 106 can be copper sulfide ($CU_2S$, CuS) formed on the conductive layer via plasma enhanced chemical vapor deposition (PECVD) utilizing a metal organic gas precursor. This process can also be referred to as metal organic chemical vapor deposition (MOCVD), and mitigates toxic hydrogen sulfide ($H_2S$) gas that would otherwise be present during the process. Examples of other conductivity facilitating compounds that can be employed for the passive layer 106 include one or more of the following: copper oxide (CuO, $Cu_2O$), manganese oxide ($MnO_2$), titanium dioxide ($TiO_2$), indium oxide ($I_3O_4$), silver sulfide ($Ag_2S$, AgS), iron oxide ($Fe_3O_4$), and the like.

The passive layer 106 is operative to transport charge from the first electrode 104 to the interface between the organic layer 108 and the passive layer 106. Additionally, the passive layer 106 facilitates charge carrier (e.g., electrons or holes) injection into the organic layer 108 and increases the concentration of the charge carrier in the organic layer resulting in a modification of the conductivity of the organic layer 108. Furthermore, the passive layer 106 can also store opposite charges in the passive layer 106 in order to balance the total charge of the device 100.

The passive layer 106 can in some instances act as a catalyst when forming the organic layer 108. In this connection, a backbone of a conjugated organic molecule may initially form adjacent the passive layer 106, and grow or assemble away and substantially perpendicular to the passive layer surface. As a result, the backbones of the conjugated organic molecule may be self aligned in a direction that traverses the two electrodes.

The organic layer 108 is formed on the passive layer 106 and results in an interface between the two layers. The organic layer 108 can be formed via a number of suitable techniques. One such technique involves growing the organic layer 108 from the passive layer 106. Another technique that can be utilized is a spin-on technique which involves depositing a mixture of the material and a solvent, and then removing the solvent from the substrate/electrode. Another suitable technique is chemical vapor deposition (CVD). CVD includes low pressure chemical vapor deposition (LPCVD), plasma enhanced chemical vapor deposition (PECVD), and high density chemical vapor deposition (HDCVD). It is not typically necessary to functionalize one or more ends of the organic molecule in order to attach it to an electrode/passive layer. Sometime it may have a chemical bond formed between the conjugated organic polymer and the passive layer 106.

The organic layer 108 is typically comprised of a conjugated organic material, such as a small organic molecule and a conjugated polymer. If the organic layer is polymer, a polymer backbone of the conjugated organic polymer may extend lengthwise between the electrodes 104 and 110 (e.g., generally substantially perpendicular to the inner, facing surfaces of the electrodes 104 and 110). The conjugated organic molecule can be linear or branched such that the backbone retains its conjugated nature. Such conjugated molecules are characterized in that they have overlapping π orbitals and that they can assume two or more resonant structures. The conjugated nature of the conjugated organic materials contributes to the controllably conductive properties of the selectively conductive media.

In this connection, the conjugated organic material has the ability to donate and accept charges (holes and/or electrons). Generally, the conjugated organic molecule has at least two relatively stable oxidation-reduction states. The two relatively stable states permit the conjugated organic polymer to donate and accept charges and electrically interact with the conductivity facilitating compound.

The organic material may be cyclic or acyclic. For some cases, such as organic polymers, the organic material self assembles between the electrodes during formation or deposition. Examples of conjugated organic polymers include one or more of polyacetylene (cis or trans); polyphenylacetylene (cis or trans); polydiphenylacetylene; polyaniline; poly(p-phenylene vinylene); polythiophene; polyporphyrins; porphyrinic macrocycles, thiol derivatized polyporphyrins; polymetallocenes such as polyferrocenes, polyphthalocyanines; polyvinylenes; polystiroles; and the like. Additionally, the properties of the organic material can be modified by doping with a suitable dopant (e.g., salt).

The top electrode 110 is formed on/over the organic layer 108 and/or the passive layer 106. The top electrode 110 can be formed prior to the formation of the organic layer 108 depending on which technique is employed to form the organic layer 108. The top electrode 110 is comprised of a conductive material such as nickel, cobalt, chromium, silver, copper, other suitable materials, and/or alloys thereof. Additionally, alloys with copper and alloys with phosphor and boron can also be employed.

The thickness of the bottom electrode 104 and the top electrode 110 can vary depending on the implementation and the memory cell being constructed. However, some exemplary thickness ranges include about 0.01 $\mu$m or more and about 10 $\mu$m or less, about 0.05 $\mu$m or more and about 5 $\mu$m or less, and/or about 0.1 $\mu$m or more and about 1 $\mu$m or less.

The organic layer 108 and the passive layer 106 are collectively referred to as a selectively conductive media or a selectively conductive layer. The conductive properties of this media (e.g., conductive, non-conductive, semi-conductive) can be modified in a controlled manner by applying various voltages across the media via the electrodes 104 and 110.

The organic layer 108 has a suitable thickness that depends upon the chosen implementations and/or the memory cell being fabricated. Some suitable exemplary ranges of thickness for the organic polymer layer 108 are about 0.001 $\mu$m or more and about 5 $\mu$m or less, about 0.01 $\mu$m or more and about 2.5 $\mu$m or less, and about a thickness of about 0.05 $\mu$m or more and about 1 $\mu$m or less. Similarly, the passive layer 106 has a suitable thickness that can vary based on the implementation and/or memory cell being fabricated. Some examples of suitable thicknesses for the passive layer 106 are as follows: a thickness of about 2 Å or more and about 0.1 $\mu$m or less, a thickness of about 10 Å or more and about 0.01 $\mu$m or less, and a thickness of about 50 Å or more and about 0.005 $\mu$m or less.

In order to facilitate operation of the organic memory cell 100, the organic layer 108 is generally thicker than the passive layer 106. In one aspect, the thickness of the organic layer is from about 0.1 to about 500 times greater than the thickness of the passive layer. It is appreciated that other suitable ratios can be employed in accordance with the present invention.

The organic memory cell 100, like conventional memory cells, can have two states, a conductive (low impedance or "on") state or non-conductive (high impedance or "off") state. However, unlike conventional memory cells, the organic memory cell is able to have/maintain a plurality of states, in contrast to a conventional memory cell that is limited to two states (e.g., off or on). The organic memory cell can employ varying degrees of conductivity to identify additional states. For example, the organic memory cell can have a low impedance state, such as a very highly conductive state (very low impedance state), a highly conductive state (low impedance state), a conductive state (medium level impedance state), and a non-conductive state (high impedance state) thereby enabling the storage of multiple bits of information in a single organic memory cell, such as 2 or more bits of information or 4 or more bits of information (e.g., 4 states providing 2 bits of information, 8 states providing 3 bits of information . . . ).

During typical device operation, electrons flow from the second electrode 110 through the selectively conductive media to the first electrode 104 based on a voltage applied to the electrodes if the organic layer is n-type conductor. Alternately, holes flow from the first electrode 104 to second electrode 110 if the organic layer 108 is p-type conductor, or both electrons and holes flow in the organic layer if it can be both n and p type with proper energy band match with 106 and 110. As such, current flows from the first electrode 104 to the second electrode 110 via the selectively conductive media.

Switching the organic memory cell to a particular state is referred to as programming or writing. Programming is accomplished by applying a particular voltage (e.g., 9 volts, 2 volts, 1 volts, . . . ) across the selectively conductive media via the electrodes 104 and 110. The particular voltage, also referred to as a threshold voltage, varies according to a respective desired state and is generally substantially greater than voltages employed during normal operation. Thus, there is typically a separate threshold voltage that corresponds to respective desired states (e.g., "off", "on" . . . ). The threshold value varies depending upon a number of factors including the identity of the materials that constitute the organic memory cell, the thickness of the various layers, and the like.

Generally speaking, the presence of an external stimuli such as an applied electric field that exceeds a threshold value ("on" state) permits an applied voltage to write, read, or erase information into/from the organic memory cell; whereas the absence of the external stimuli that exceeds a threshold value ("off" state) prevents an applied voltage to write or erase information into/from the organic memory cell.

To read information from the organic memory cell, a voltage or electric field (e.g., 2 volts, 1 volts, 0.5 volts) is applied via a voltage source. Then, an impedance measurement is performed which, therein determines which operating state the memory cell is in (e.g., high impedance, very low impedance, low impedance, medium impedance, and the like). As stated supra, the impedance relates to, for example, "on" (e.g., 1) or "off" (e.g., 0) for a dual state device or to "00", "01", "10", or "11" for a quad state device. It is appreciated that other numbers of states can provide other binary interpretations. To erase information written into the organic memory cell, a negative voltage or a polarity opposite the polarity of the writing signal that exceeds a threshold value is applied.

Figure 2:
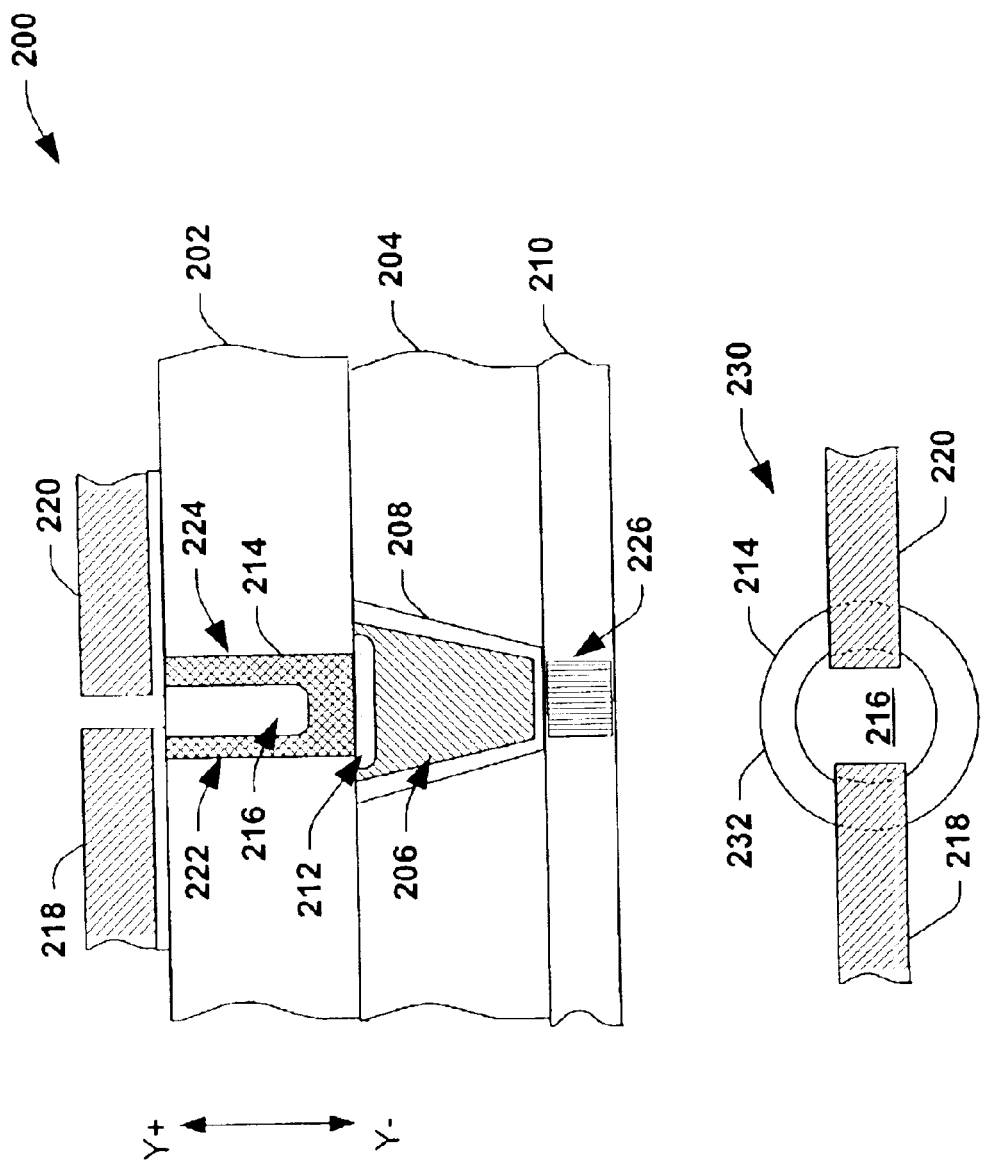
FIG. 2 is another schematic cross sectional illustration of a portion of a wafer depicting a memory cell formed thereon, a portion of which can be formed in accordance with one or more aspects of the present invention.

FIG. 2 is a cut away view illustrating another organic memory cell 200, a portion of which can be formed in accordance with one or more aspects of the present invention. The memory cell is a multi-cell memory device. For illustrative purposes, a dual cell structure is described for the memory device 200 although it is to be appreciated that memory structures having more than two cells can be created. The memory device 200 includes various dielectric layers such as layers 202 and 204, wherein such layers are also referred to as an inner layer dielectric (ILD). Such layers 202 and 204 can be semiconductor material, for example, and/or substantially any type material having dielectric properties. Within layer 204, a lower electrode 206 is formed having an associated barrier layer 208 that mitigates diffusion of the lower electrode 206 into a subsequent layer 210. The lower electrode 206 is a generally conductive material, such as copper, but can also include, for example, any other suitable conductive material such as aluminum, chromium, germanium, gold, magnesium, manganese, indium, iron, nickel, palladium, platinum, silver, titanium, zinc, alloys thereof, indium-tin oxide, polysilicon, doped amorphous silicon, metal silicides, and the like. Examples of alloys that can be utilized for the conductive material include Hastelloy®, Kovar®, Invar, Monel®, Inconel®, brass, stainless steel, magnesium-silver alloy, and various other alloys.

A passive layer 212 is formed above the lower electrode 206 in accordance with one or more aspects of the present invention. The passive layer can, for example, be copper sulfide ($Cu_2S$, CuS) and can be formed on the conductive lower electrode 206 by plasma enhanced chemical vapor deposition (PECVD) or metal organic chemical vapor deposition (MOCVD) wherein a metal organic gas precursor is utilized and the presence of toxic hydrogen sulfide ($H_2S$) is thereby mitigated during the formation process. The lower electrode 206 and associated passive layer (or layers) 212 cooperate as a common activation or access element for the multi-cell memory device 200.

After the passive layer 212 has been added, the dielectric layer 202 is added above the layer 204, and organic semiconductor material 214 is formed within the layer 202. Such organic material can be, for example, a polymer including organic polymers, such as one or more of polyacetylene (cis or trans); polyphenylacetylene (cis or trans); polydiphenylacetylene; polyaniline; poly(p-phenylene vinylene); polythiophene; polyporphyrins; porphyrinic macrocycles, thiol derivatized polyporphyrins; polymetallocenes such as polyferrocenes, polyphthalocyanines; polyvinylenes; polystiroles; and the like.

The organic material 214 is partially filled with a dielectric material 216. Such a dielectric material can include, for example, silicon oxide (SiO), silicon dioxide ($SiO_2$), silicon nitride ($Si_3N_4$), (SiN), silicon oxynitride ($SiO_xN_y$), fluorinated silicon oxide ($SiO_xF_y$), polysilicon, amorphous silicon, tetraethyorthosilicate (TEOS), phosphosilicate glass (PSG), borophosphosilicate glass (BPSG), any suitable spin-on glass, polyimide(s) or any other suitable insulating material. As illustrated, two conductive electrodes 218 and 220 are formed above the organic material 214 (can also include barrier layers between top electrodes and organic material), whereby memory cells 222 and 224 are formed in vertical portions (Y+ and Y− directions) of the organic material 214. Thus, if a suitable voltage is applied between electrode 218 and electrode 206, a storage state (e.g., 1, 0, other impedance state) can be stored in (or read from) the memory cell 222, whereas if a suitable voltage is applied between electrode 220 and electrode 206, a storage state can be stored in (or read from) the memory cell 224.

As noted above, multiple electrodes can be formed above the organic material 214 to form more than two memory cells. Moreover, a plurality of such multi-cell memory devices 200 can be manufactured in accordance with an Integrated Circuit (IC) memory device (e.g., 1 Mbit, 2 Mbit, 8 Mbit storage cells, . . . and so forth, constructed as a non-volatile memory IC). In addition, common-word lines such as illustrated at 226 in layer 210 can be provided to store, erase, read, and write a plurality of multi-cell structures in accordance with the present invention (e.g., 8/16 byte/word erase, read, write).

Referring briefly to reference numeral 230 of FIG. 1, a top view illustrates the dual cell structure of the memory device 200. As can be observed from the top of the structure 230, a cylinder shape (or multi-dimension) structure 232 is formed from the combination of organic material 214 and dielectric material 216 described above.

Figure 3:
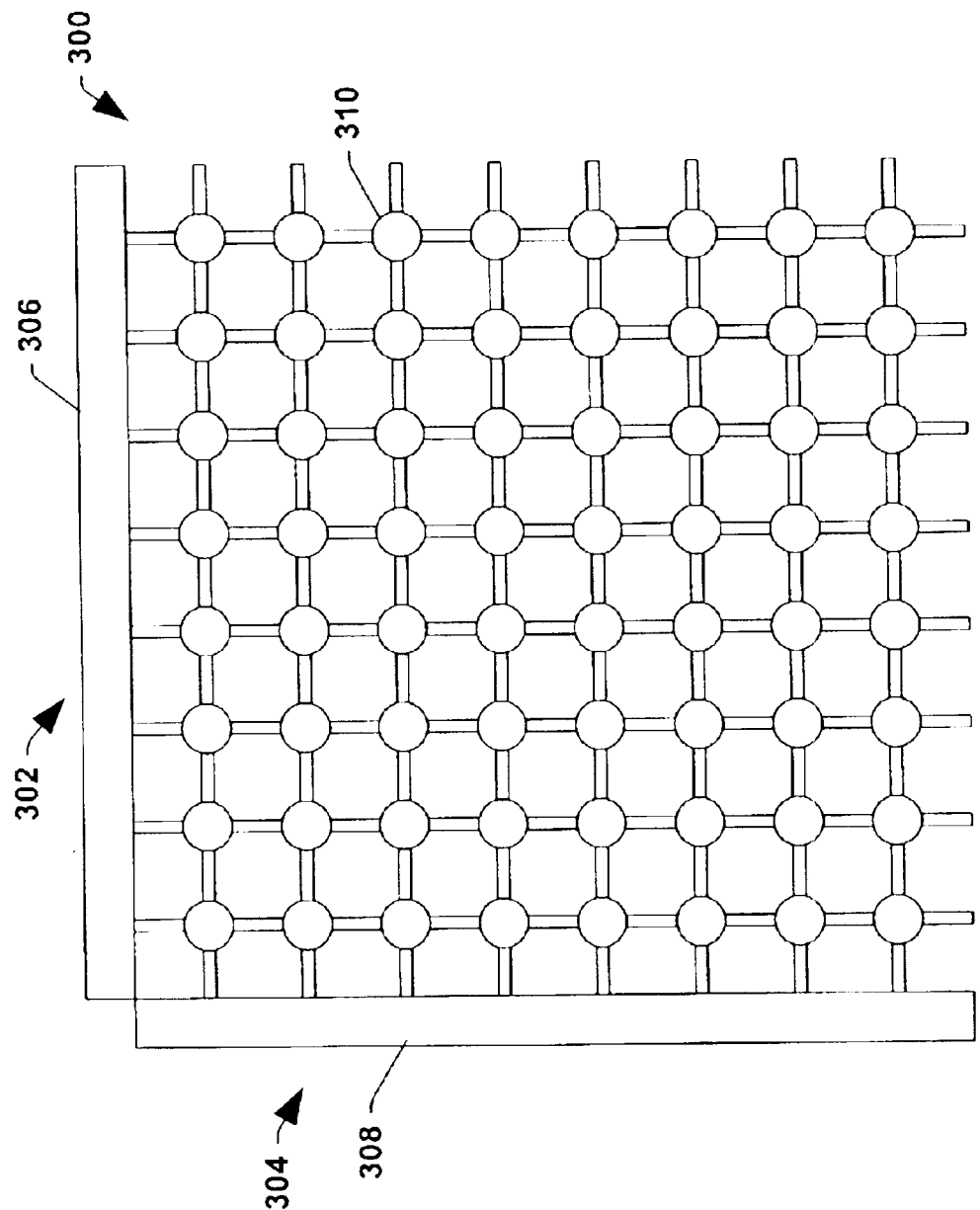
FIG. 3 illustrates an array of memory cells, such as may be composed of cells, portions of which may be formed in accordance with one or more aspects of the present invention.

Turning to FIG. 3, an array 300 of memory cells, such as can include the memory cells described herein, is illustrated. Such an array is generally formed on a silicon based wafer, and includes a plurality of columns 302, referred to as bitlines, and a plurality of rows 304, referred to as wordlines. The intersection of a bitline and a wordline constitutes the address of a particular memory cell. Data can be stored in the memory cells (e.g., as a 0 or a 1) by choosing and sending signals to appropriate columns and rows in the array (e.g., via a column address strobe (CAS) 306 and a row address strobe (RAS) 308, respectively). For example, the state (e.g., a 0 or a 1) of the memory cell indicated at 310 is a function of the $3^{rd}$ row and $8^{th}$ column of the array 300. In dynamic random access memory (DRAM), for example, memory cells include transistor-capacitor pairs. To write to a memory cell, a charge can be sent to the appropriate column (e.g., via CAS 306) to activate the respective transistors in the columns, and the state that respective capacitors should take on can be sent to the appropriate columns (e.g., via RAS 308). To read the state of the cells, a sense-amplifier can determine the level of charge on the capacitors. If it is more than 50 percent, it can be read as a 1; otherwise it can be read as a 0. It is to be appreciated that while the array 300 illustrated in FIG. 3 includes 64 memory cells (e.g., 8 rows×8 columns), the present invention has application to any number of memory cells and is not to be limited to any particular configuration, arrangement and/or number of memory cells.

Figure 4:
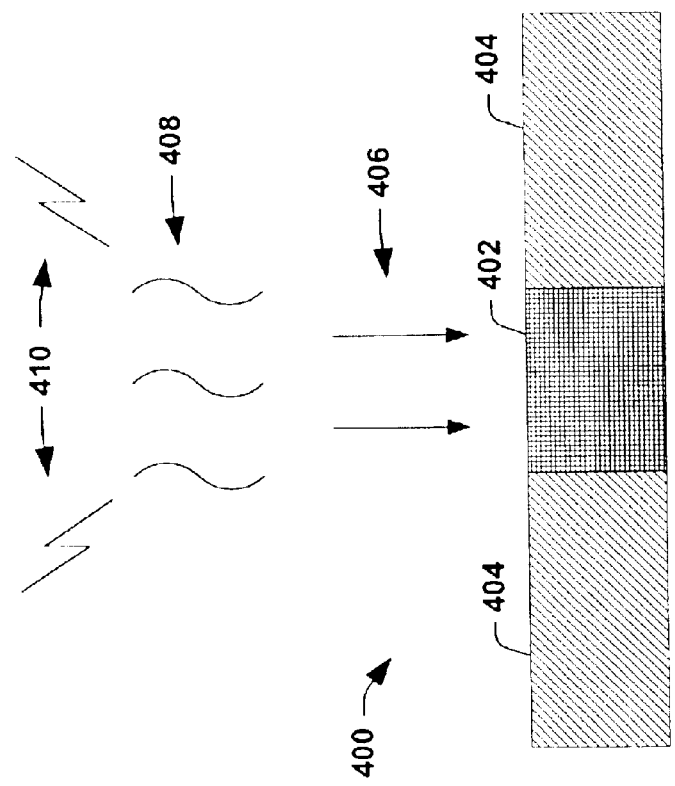
FIG. 4 is a schematic cross sectional illustration of a portion of a conductive layer (surrounded by ILD) whereon copper sulfide can be deposited in forming a memory cell in accordance with one or more aspects of the present invention.

Turning to FIG. 4, a cut away view of a layer 400 that can be utilized in forming a memory cell is illustrated. Such a memory cell can, for instance, correspond to the memory cell described above with respect to FIG. 1. The layer includes a conductive layer 402 (e.g., corresponding to the bottom electrode 104 depicted in FIG. 1) surrounded on either side by dielectric or insulating material 404, which can also be referred to as an inner layer dielectric (ILD). The dielectric material 404 can, for example, be formed in any suitable manner (e.g., via growth, deposition, spin-on and/or sputtering techniques), and then etched to form an aperture therein, which can subsequently be filled with conductive material to form the conductive layer. The dielectric material 404 and conductive layer 402 can then be polished back (e.g., via chemical mechanical polishing (CMP)) to produce the desired uniformity and height/thickness dimensions across the layer. Alternatively, the conductive layer 402 can be formed first and the dielectric material 404 can be formed adjacent to (and even over the conductive layer) and the dielectric material and conductive layer can then be polished and/or etched back to produce the layer 400 at the desired dimensions.

The conductive layer 402 can include, for example, copper as well as any other suitable conductive material such as aluminum, chromium, germanium, gold, magnesium, manganese, indium, iron, nickel, palladium, platinum, silver, titanium, zinc, alloys thereof, indium-tin oxide, polysilicon, doped amorphous silicon, metal silicides, and the like. Examples of alloys that can be utilized for the conductive material include Hastelloy®, Kovar®, Invar, Monel®, Inconel®, brass, stainless steel, magnesium-silver alloy, and various other alloys. Some exemplary thickness ranges for the conductive layer and surrounding dielectric material include about 0.01 $\mu$m or more and about 10 $\mu$m or less, about 0.05 $\mu$m or more and about 5 $\mu$m or less, and/or about 0.1 $\mu$m or more and about 1 $\mu$m or less. The dielectric material 404 can include, for example, silicon oxide (SiO), silicon dioxide ($SiO_2$), silicon nitride ($Si_3N_4$), (SiN), silicon oxynitride ($SiO_xN_y$), fluorinated silicon oxide ($SiO_xF_y$), polysilicon, amorphous silicon, tetraethyorthosilicate (TEOS), phosphosilicate glass (PSG), borophosphosilicate glass (BPSG), any suitable spin-on glass, polyimide(s) or any other suitable insulating material.

In accordance with one or more aspects of the present invention, a thin film of conductivity facilitating material such as copper sulfide ($Cu_2S$, CuS) can be formed on the conductive layer to act as a passive layer (e.g., layer 106 in FIG. 1) and facilitate conductivity between the conductive layer and other layers that will subsequently be formed to comprise a stack making up a memory cell. The copper sulfide ($Cu_2S$, CuS) can be formed as a thin film on the conductive layer via plasma enhanced chemical vapor deposition. A gaseous form of copper sulfide 406 is introduced above the conductive layer, with helium optionally being utilized as a carrier gas. A metal organic gas precursor 408 is utilized in the process, which is activated by a constant power rf excitation source 410 to develop a plasma. The metal organic precursor mitigates the need for highly toxic hydrogen sulfide ($H_2S$) within the process. The metal organic precursor 408 can be, for example, chelate Cu (II) diethyldithiocarbamate or $CU(S_2CN(C_2H_5)_2)_2$ (II). The deposition can take place under relatively low pressure and temperature conditions (e.g., about 0.2 Pa. and between about 473 to 573 K, respectively).

Figure 5:
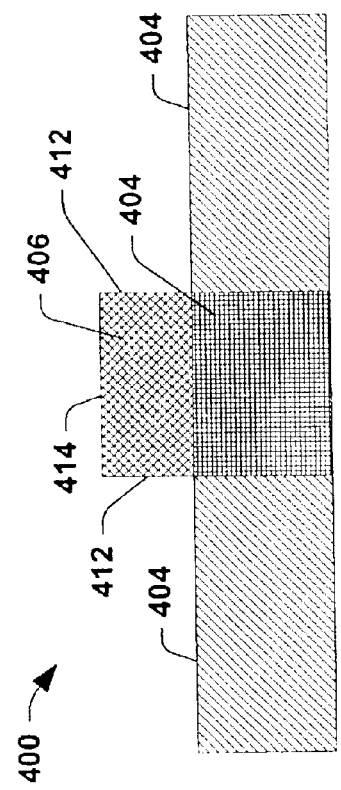
FIG. 5 is a schematic cross sectional illustration of a portion of a conductive layer (surrounded by ILD) whereon copper sulfide has been deposited via a plasma enhanced chemical vapor deposition process (PECVD) in forming a memory cell in accordance with one or more aspects of the present invention.

The formed layer of conductivity facilitating compound 406 is depicted in FIG. 5, and can have, for example, a thickness between about 200 to 600 nm, a refractive index from about 2.0 to 2.21, a resistivity of about $5.7 \times 10^{-2}$ Ohm cm and can be transparent with a transmittance of about 60% between 600 and 700 nm. It will be appreciated that the present invention is not to be strictly limited by these parameters as they are merely exemplary of but some of the many process parameters and properties of the film that can exist according to one or more aspects of the present invention. It will be further appreciated that the layer of copper sulfide 406 can undergo further processing to achieve particular configurations, such as the substantially rectangular configuration illustrated in FIG. 5. For example, the layer of copper sulfide can be subjected to a very controlled etching process to establish the degree of planarity depicted on the sides 412 of the copper sulfide layer illustrated in FIG. 5. Additionally, further etching and/or chemical mechanical polishing can also be performed to achieve a desired level of uniformity across the top surface 414 of the copper sulfide layer 406.

Turning to FIG. 6, a cut away view of another layer 600 that can be utilized in forming a memory cell is illustrated. Such a memory cell can, for instance, correspond to the memory cell described above with respect to FIG. 2. The layer includes a conductive layer 602 (e.g., corresponding to the lower electrode 206 depicted in FIG. 2) surrounded on either side by dielectric material 604, also known as an inner layer dielectric (ILD) (e.g., corresponding to the layer 204 in FIG. 2). The layer 600 is non-uniform in that the conductive layer 602 has a height/thickness that is slightly less than that of the surrounding dielectric material 604. As with the layer illustrated in FIG. 4, the dielectric or insulating material 604 can be formed in any suitable manner (e.g., via growth, deposition, spin-on and/or sputtering techniques), and then etched to form an aperture 608 therein, which can subsequently be filled with conductive material to form the conductive layer 602. However, the volume of conductive material deposited into the aperture 608 may be limited such that the surface 610 of the conductive layer 602 is not flush with the surface 612 of the dielectric material 604. Alternatively, or in addition, the volume of conductive material deposited into the aperture may be sufficient to establish the conductive layer 602 to a level above, equal to or slightly below the surrounding dielectric material 604. If the conductive layer is established to a level above or equal to the dielectric material, then both the dielectric and conductive materials can initially be polished or etched back to achieve a desired height and level of uniformity, and the conductive layer can then be etched back to achieve a desired height. If the conductive layer 602 is not established to the level of the surrounding dielectric material 604, then the dielectric material may or may not be polished back prior to etching the conductive layer to a desired height and/or level of uniformity.

It will be appreciated that the conductive layer 602 can include, for example, copper as well as any other suitable conductive material such as aluminum, chromium, germanium, gold, magnesium, manganese, indium, iron, nickel, palladium, platinum, silver, titanium, zinc, alloys thereof, indium-tin oxide, polysilicon, doped amorphous silicon, metal silicides, and the like. Examples of alloys that can be utilized for the conductive material include Hastelloy®, Kovar®, Invar, Monel®, Inconel®, brass, stainless steel, magnesium-silver alloy, and various other alloys. Some exemplary thickness ranges for the conductive layer utilized in a memory cell include about 0.01 $\mu$m or more and about 10 $\mu$m or less, about 0.05 $\mu$m or more and about 5 $\mu$m or less, and/or about 0.1 $\mu$m or more and about 1 $\mu$m or less. The dielectric material 604 can include, for example, silicon oxide (SiO), silicon dioxide ($SiO_2$), silicon nitride ($Si_3N_4$), (SiN), silicon oxynitride ($SiO_xN_y$), fluorinated silicon oxide ($SiO_xF_y$), polysilicon, amorphous silicon, tetraethyorthosilicate (TEOS), phosphosilicate glass (PSG), borophosphosilicate glass (BPSG), any suitable spin-on glass, polyimide(s) or any other suitable insulating material. It will be appreciated that the thickness of the dielectric material will be slightly greater than the thickness of the conductive layer.

In accordance with one or more aspects of the present invention, a thin film of conductivity facilitating material such as copper sulfide ($Cu_2S$, CuS) can be formed on the conductive layer to act as a passive layer (e.g., layer 30 in FIG. 2). The thin film can be formed to a thickness so as to be flush with the surrounding dielectric material. Alternatively, the film can be formed to a thickness that exceeds the level of the dielectric material, and then be polished back to be flush with the dielectric material. The film facilitates conductivity between the conductive layer and other layers that will subsequently be formed to comprise a stack making up a memory cell.

The thin film can be formed on the conductive layer via plasma enhanced chemical vapor deposition. To form a thin film of copper sulfide ($Cu_2S$, CuS), a gaseous form of copper sulfide 614 is introduced above the conductive layer, with helium optionally being utilized as a carrier gas. A metal organic gas precursor 616 is utilized in the process, which is activated by a constant power rf excitation source 618 to generate a plasma. Utilization of the metal organic precursor 616 mitigates the need for highly toxic hydrogen sulfide ($H_2S$) within the process. The metal organic precursor can be, for example, chelate Cu (II) diethyldithiocarbamate or $Cu(S_2CN(C_2H_5)_2)_2$ (II). The process can transpire under relatively low pressure and temperature conditions (e.g., about 0.2 Pa. and between about 473 to 573 K, respectively).

The formed layer of conductivity facilitating compound 614 is depicted in FIG. 7, and can have, for example, a thickness between about 200 to 600 nm, a refractive index from about 2.0 to 2.21, a resistivity of about $5.7 \times 10^{-2}$ Ohm cm and can be transparent with a transmittance of about 60% between 600 and 700 nm. It will be appreciated that these film properties and processing operating parameters are exemplary of but a few of the many different possibilities associated with aspects of the present invention, and that the present invention is thus not intended to be strictly limited thereby.

Figure 8:
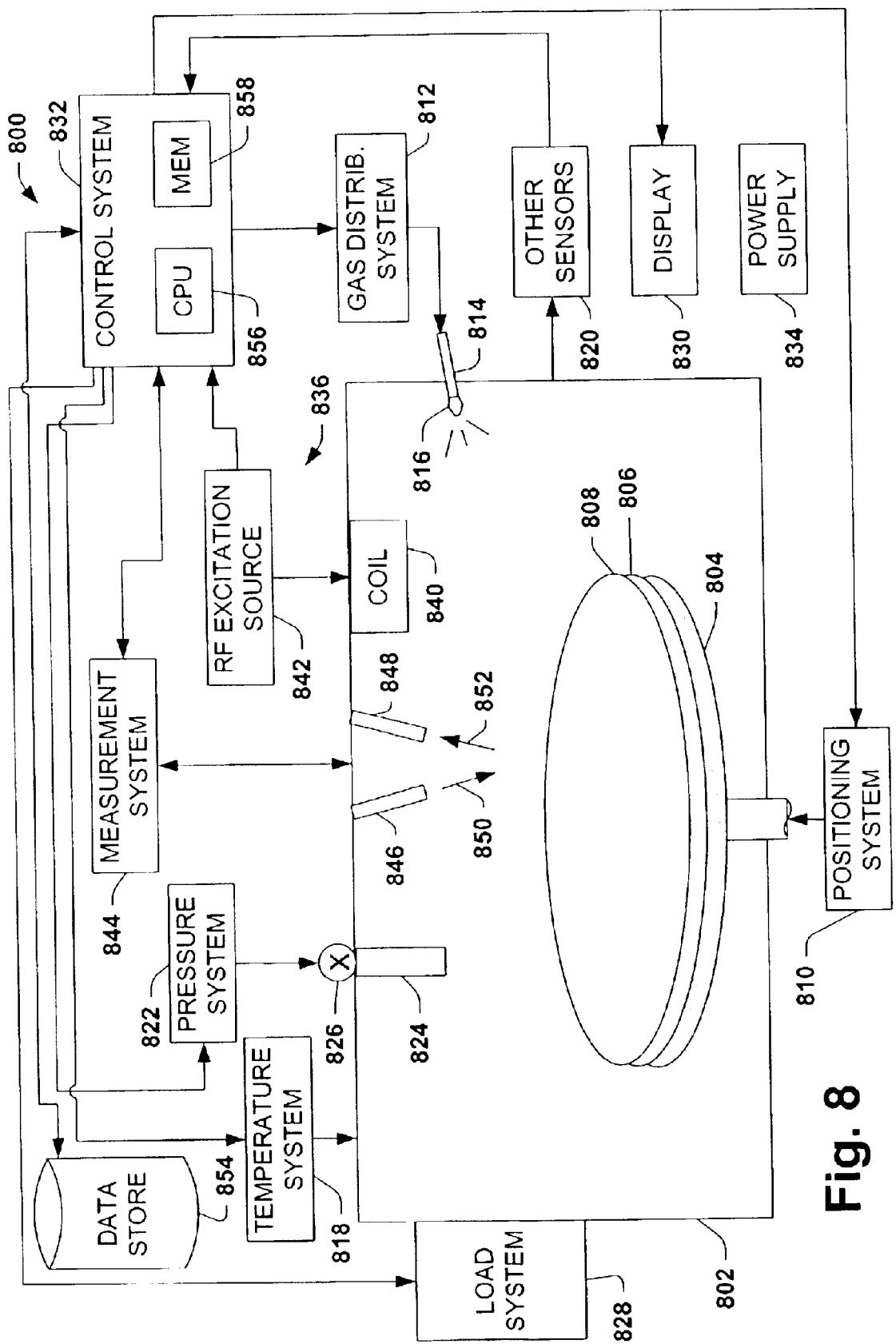
FIG. 8 is a schematic block diagram illustrating a system for depositing copper sulfide on a conductive layer in the manufacture of one or more memory cells in accordance with one or more aspects of the present invention.

FIG. 8 is a schematic block diagram illustrating a system 800 for forming a thin film of conductivity facilitating (e.g., copper sulfide ($Cu_2S$, $CuS$)) on a layer of conductive material (e.g., copper) in accordance with one or more aspects of the present invention, and more particularly via a plasma enhanced chemical vapor deposition process (PECVD) utilizing a metal organic gas precursor. It will be appreciated that formation rates may vary in response to factors including, but not limited to, gas compositions and/or concentrations, excitation voltages, temperatures and/or pressures. The formation described herein can be utilized as part of a semiconductor fabrication process wherein one or more memory cells are produced on a wafer.

The system 800 includes a chamber 802 defined by a housing having a plurality of walls. The chamber 802 includes a support, such as may include a stage 804 (or chuck) operative to support a wafer 806 which includes a layer of conductive material 808 upon which copper sulfide can be selectively formed as part of producing one or more memory cells. A positioning system 810 is operatively connected to the support 804 for selectively maneuvering the wafer 806 into desired positions within the chamber 802. It is to be appreciated that any suitable positioning system may be employed in accordance with one or more aspects of the present invention. It is to be further appreciated that the conductive material can be copper as well as any other suitable conductive material such as aluminum, chromium, germanium, gold, magnesium, manganese, indium, iron, nickel, palladium, platinum, silver, titanium, zinc, alloys thereof, indium-tin oxide, polysilicon, doped amorphous silicon, metal silicides, and the like. Examples of alloys that can be utilized for the conductive material include Hastelloy®, Kovar®, Invar, Monel®, Inconel®, brass, stainless steel, magnesium-silver alloy, and various other alloys.

A gas distribution system 812 is operatively coupled to the chamber 802 for selectively providing gaseous chemicals into the chamber at various rates, volumes, concentrations, etc. base upon, among other things, the amount (thickness) of film to be formed, the composition of film(s) to be formed, the pressure within the chamber, the temperature within the chamber and/or the size of the chamber, for example. By way of illustration, the gas distribution system 812 includes one or more sources of gaseous medium (a vapor) of one or more chemical(s). In the example illustrated, the gases are provided into the chamber through a conduit 814 that terminates in a nozzle 816. While, for purposes of brevity, a single nozzle 816 is shown in FIG. 8, it is to be appreciated that more than one nozzle or other gas delivery mechanisms may be utilized to provide gas into the chamber 802 at various mixtures and/or concentrations in accordance with one or more aspects of the present invention. For example, a shower head type gas delivery mechanism can be implemented to more evenly provide chemicals into the chamber above the wafer 806, which can facilitate a more uniform chemical vapor deposition on and across the wafer. The gas distribution system 812 injects a metal organic gas into the chamber to function as a precursor in the chemical vapor deposition process. The metal organic precursor can be, for example, chelate Cu (II) diethyldithiocarbamate or $CU(S_2CN(C_2H_5)_2)_2$ (II), which mitigates the need for highly toxic hydrogen sulfide ($H_2S$) within the process. A gaseous form of conductivity facilitating material, such as copper sulfide ($Cu_2S$, $CuS$), is also provided into the chamber for deposition onto the conductive layer. A gaseous form of helium can also be provided into the chamber along with the copper sulfide to serve as a carrier gas. It will be appreciated that other gases or plasma substances can be injected into the chamber to facilitate depositing the copper sulfide onto the conductive layer.

A temperature system 818 also is provided for selectively regulating the temperature within the chamber 802. For example, the system 818 may be a diffusion type system (e.g., a horizontal or vertical furnace) operable to diffusion heat into the chamber 802. The temperature system 818 may implement its own temperature control process or such control may be implemented as part of other sensors 820 operatively associated with the etching chamber 802. By way of example, the plasma enhanced chemical vapor deposition of copper sulfide can be carried out at a relatively low temperature of between about 400 to 600 K. A pressure system 822 is also included in the system to selectively regulate the pressure within the chamber. The pressure system 822 may include, for example, one or more vent conduits 824 having valves 826 that may be controllably opened and/or closed to varying degrees to assist with selectively adapting the pressure within the chamber 802. The deposition of copper sulfide can similarly be performed at a relatively low pressure of between about 0.05 to 0.5 Pa.

The system 800 can also include a load system 828 operatively connected to the chamber 802 for loading and unloading wafers into and out of the etching chamber. The load system 828 typically is automated to load and unload the wafers into the chamber at a controlled rate. The system further may include a display 830 operatively coupled to a control system 832 for displaying a representation (e.g., graphical and/or textual) of one or more operating parameters (e.g., temperature within the chamber, pressure within the chamber, thickness of material deposited, chart of rate of material being deposited).

A power supply 834 is included to provide operating power to components of the system 800. Any suitable power supply (e.g., battery, line power) suitable for implementation with the present invention can be utilized. An excitation system 836 is operatively associated with the chamber 802. The system 836 includes a coil 840 and an RF excitation (e.g., voltage) source 842 wherein the coil 840 is excited by the RF excitation source 842 which in turn electrically excites one or more gases within the chamber to facilitate deposition of one or more gases, and in this case the copper sulfide, onto an underlying layer, such as the conductive layer. In particular, an rf plasma field generated by the excited coil and the metal oxide precursor activates the process of depositing the gaseous conductivity facilitating copper sulfide (optionally carried by gaseous helium) onto the conductive layer.

The system can also include a measurement system 844 for in-situ monitoring of processing within the chamber, such as, for example, thickness of film being deposited. The monitoring system 844 can be a standalone component and/or can also be distributed between two or more cooperating devices and/or processes. Similarly, the monitoring system 844 can reside in one physical or logical device (e.g., computer, process) and/or be distributed between two or more physical or logical devices. The measurement system 844 includes one or more non-destructive measurement components, such as may utilize optical interference, scatterometry, IR spectroscopy, ellipsometry, scanning electron microscopy, synchrotron and/or x-ray diffraction techniques. The measurement system includes a beam source 846 and detector 848. It is to be appreciated that while one beam source 846 and one beam detector 848 are shown in the example illustrated, more than one of these components may be included to measure film thickness and/or compositions, for example, at various locations on the wafer. The source portion 846 provides one or more beam(s) 850 (e.g., of light from a frequency stabilized laser, laser diode or helium neon (HeNe) gas laser) toward the surface of the conductive layer 808 on the wafer 806 whereon copper sulfide is deposited. The beam 820 interacts with the film and is altered thereby (e.g., reflected, refracted, diffracted). The altered beam(s) 852 are received at the detector portion 848 of the measurement system 844 and have beam properties (e.g., magnitude, angle, phase, polarization), which can be examined relative to that of the incident beam(s) 850 to determine an indication of one or more properties of the film being deposited (e.g., thickness, chemical species). A plurality of incident beams from one or more sources directed at different spaced apart locations may be employed, for example, to yield corresponding measurements of film thickness at these locations substantially concurrently during the process. The concurrent measurements, in turn, may provide an indication of deposition uniformity and may be useful in controlling the process to efficiently and economically achieve desired results and mitigate the need for and/or degree of subsequent processing steps, such as, for example, selective re-deposition of copper sulfide and/or chemical mechanical polishing at particular locations on the wafer.

With respect to optical interference, for example, the intensity of light over a selected wavelength varies as a function of surface properties (e.g., thickness, chemical composition). For spectroscopic ellipsometry, thickness varies based on the state of polarization of light reflected from the film, which is functionally related to the index of refraction of the material reflecting the beam 852.

Using a scatterometry technique, for example, desired information concerning film thickness and/or chemical composition can be extracted by comparing the phase and/or intensity (magnitude) of the light directed onto the surface of the film with phase and/or intensity signals of a complex reflected and/or diffracted light resulting from the incident light reflecting from the surface of the film upon which the incident light was directed. The intensity and/or the phase of the reflected and/or diffracted light will change based on properties (e.g., thickness, chemical species) of the film upon which the light is directed.

Substantially unique intensity/phase signatures can be developed from the complex reflected and/or diffracted light. The measurement system 844 provides information indicative of the measured properties to the control system 832. Such information may be the raw phase and intensity information. Alternatively or additionally, the measurement system 844 may be designed to derive an indication of film thickness, for example, based on the measured optical properties and provide the control system 832 with a signal indicative of the measured film thickness according to the detected optical properties. The phase and intensity of the reflected light can be measured and plotted to assist with such determinations, such as, for example, by way of derived curve comparisons.

In order to determine film thickness, for example, measured signal characteristics may be compared with a signal (signature) library of intensity/phase signatures to determine properties of the deposited by-products. Such substantially unique phase/intensity signatures are produced by light reflected from and/or refracted by different surfaces due, at least in part, to the complex index of refraction of the surface onto which the light is directed. The complex index of refraction (N) can be computed by examining the index of refraction (n) of the surface and an extinction coefficient (k). One such computation of the complex index of refraction can be described by the equation:

$$N = n - jk, \qquad \text{Eq. 1}$$

where j is an imaginary number.

The signal (signature) library can be constructed from observed intensity/phase signatures and/or signatures generated by modeling and simulation. By way of illustration, when exposed to a first incident light of known intensity, wavelength and phase, a first feature on a surface can generate a first phase/intensity signature. Similarly, when exposed to the first incident light of known intensity, wavelength and phase, a second feature on a surface can generate a second phase/intensity signature. For example, a particular type of film having a first thickness may generate a first signature while the same type of film having a different thickness may generate a second signature, which is different from the first signature. Observed signatures can be combined with simulated and modeled signatures to form the signal (signature) library. Simulation and modeling can be employed to produce signatures against which measured phase/intensity signatures can be matched. Simulation, modeling and observed signatures can, for example, be stored in a signal (signature) library or data store 854 containing, for example, thousands of phase/intensity signatures. Such a data store 854 can store data in data structures including, but not limited to one or more lists, arrays, tables, databases, stacks, heaps, linked lists and data cubes. Thus, when the phase/intensity signals are received from scatterometry detecting components, the phase/intensity signals can be pattern matched, for example, to the library of signals to determine whether the signals correspond to a stored signature. Interpolation between the two closest matching signatures further may be employed to discern a more accurate indication of thickness and/or composition from the signatures in the signature library. Alternatively, artificial intelligence techniques may be employed to calculate desired parameters based on the detected optical properties.

It is to be appreciated that the beam 850 illustrated in FIG. 8 may be oriented at any angle relative to the surfaces of the wafer with a corresponding detector appropriately positioned for receiving the reflected beam. In addition, more than one beam may be directed toward different locations to measure the respective thickness at such different locations to facilitate a measurement of uniformity or thickness. The thickness of the material being deposited is thus determined based upon the optical properties (e.g., n and k) of emitted and reflected beams 852.

One or more other sensors 820 can also be included to monitor and/or measure selected aspects related to the processing occurring within the chamber (e.g., temperature within the chamber, pressure within the chamber, volume and/or flow rate of gasses being distributed into the chamber). These sensors 820 can provide respective signals to the control system 832 indicative of the aspects sensed thereby. The various other subsystems 812, 818, 822, 836 can further provide respective signals to the control system 832 indicative of operating conditions associated with the respective systems (e.g., degree that vent valve(s) are open, time period(s) that particular valve(s) have been closed). Considering the signals and information received from the measurement system, 844 other sensors 820 and subsystems 812, 818, 822, 836, the control system 832 can discern whether the film deposition process is proceeding as planned. If not, the control system can adapt the process by formulating and selectively providing appropriate control signals to the associated systems 810, 812, 818, 822, 828, 836, to adjust one or more of the systems (e.g., to increase the volume of copper sulfide provided into the chamber and increase the thickness of the layer being deposited).

The control system 832 can include, for example, a processor 856, such as a microprocessor or CPU, coupled to a memory 858. The processor 856 receives measured data from the measuring system 844 and corresponding other data from the other sensors 820 and subsystems 812, 818, 822, 836. The control system 832 can be configured in any suitable manner to control and operate the various components within the system 800 in order to carry out the various functions described herein. The processor 856 can be any of a plurality of processors, and the manner in which the processor 856 can be programmed to carry out the functions relating to the present invention will be readily apparent to those having ordinary skill in the art based on the description provided herein.

The memory 858 included within the control system 832 serves to store, among other things, program code executed by the processor 856 for carrying out operating functions of the system as described herein. The memory 858 may include read only memory (ROM) and random access memory (RAM). The ROM contains among other code the Basic Input-Output System (BIOS) which controls the basic hardware operations of the system 800. The RAM is the main memory into which the operating system and application programs are loaded. The memory 858 also serves as a storage medium for temporarily storing information such as, for example, thickness tables, chemical composition tables, temperature tables, pressure tables and algorithms that may be employed in carrying out one or more aspects of the present invention. The memory 858 can also serve as the data store 854 and can hold patterns against which observed data can be compared as well as other data that may be employed in carrying out the present invention. For mass data storage, the memory 858 may include a hard disk drive.

As a result, the system 800 provides for monitoring aspects associated with the processing occurring within the chamber, such as the thickness of film(s) being deposited, for example. The control system 832 may implement feedback and/or feed forward process control in response to the monitoring so as to deposit conductivity facilitating material, such as copper sulfide, in an efficient and cost effective manner. It will be appreciated that many of the components of the system 800 including the data store can, for example, reside in one physical or logical device (e.g., computer, process) and/or may be distributed between two or more physical or logical devices (e.g., disk drives, tape drives, memory units). Measuring thickness of film being deposited in-situ and adapting processing in response thereto facilitates depositing the copper sulfide at a desired rate, to a desired thickness, with a desired chemical makeup and/or with other desired properties. The conductivity facilitating copper sulfide film can, for example, have a thickness between about 200 to 600 nm, a refractive index from about 2.0 to 2.21, a resistivity of about $5.7\times10^{-2}$ Ohm cm and can be transparent with a transmittance of about 60% between 600 and 700 nm. In-situ measurement and feedback and/or feed-forward control enhances product yield and improves resulting device performance, and conductivity facilitating copper sulfide can be deposited under relatively low pressures and temperatures in the absence of toxic hydrogen sulfide ($H_2S$).

Turning now to FIGS. 9–11 a chuck 902 is shown in perspective supporting a wafer 904 whereupon conductivity facilitating material, such as copper sulfide, may be selectively formed over a conductive layer on the wafer to manufacture one or more memory cells. The wafer 904 may be logically partitioned into a grid pattern as shown in FIG. 10 to facilitate monitoring the wafer as it matriculates through a fabrication process. Each grid block (XY) of the grid pattern corresponds to a particular portion of the wafer 904, and each grid block may have one or more memory cells associated with that grid block. Portions can be individually monitored with one or more innocuous techniques such as, for example, optical interference, scatterometry, IR spectroscopy, ellipsometry, scanning electron microscopy, synchrotron and/or x-ray diffraction for properties including, but not limited to, thickness of copper sulfide deposited, concentration of copper sulfide deposited, etc. This may facilitate selectively determining to what extent, if any, fabrication adjustments are necessary to mitigate problem areas and achieve desired results.

In FIG. 10, respective plots are illustrated for measurements taken at portions of a wafer 904 corresponding to grid mapped locations of the wafer ($X_1Y_1 \ldots X_{12}, Y_{12}$). The plots can, for example, be signatures indicating whether copper sulfide is forming at an acceptable rate and/or has been formed to a desired thickness. Given the values depicted in FIG. 10, it may be determined that an undesirable condition exists at one or more locations on the wafer 904. For instance, the measurement at coordinate $X_7Y_6$ yields a plot that is substantially higher than the respective measurements of the other portions XY. This can indicate, for example, that copper sulfide is accumulating too fast at this location. As such, fabrication components and/or operating parameters associated therewith can be adjusted accordingly to mitigate this condition. For example, the degree that a vent valve is opened can be reduced so that the volume and/or rate of gaseous copper sulfide added to the process can be restricted. It is to be appreciated that although FIG. 10 illustrates the wafer 904 being mapped (partitioned) into 144 grid block portions, the wafer 904 may be mapped with any suitable number of portions to effect desired monitoring and control.

FIG. 11 illustrates a table of acceptable and unacceptable signature values. As can be seen, all the grid blocks, except grid block $X_7Y_6$, have measurement values corresponding to an acceptable value ($V_A$), while grid block $X_7Y_6$ has an undesired value ($V_U$). Thus, it has been determined that an undesirable condition exists at the portion of the wafer 904 mapped by grid block $X_7Y_6$. Accordingly, fabrication process components and parameters may be adjusted as described herein to adapt the fabrication process accordingly to mitigate the occurrence or persistence of this condition.

Figure 12:
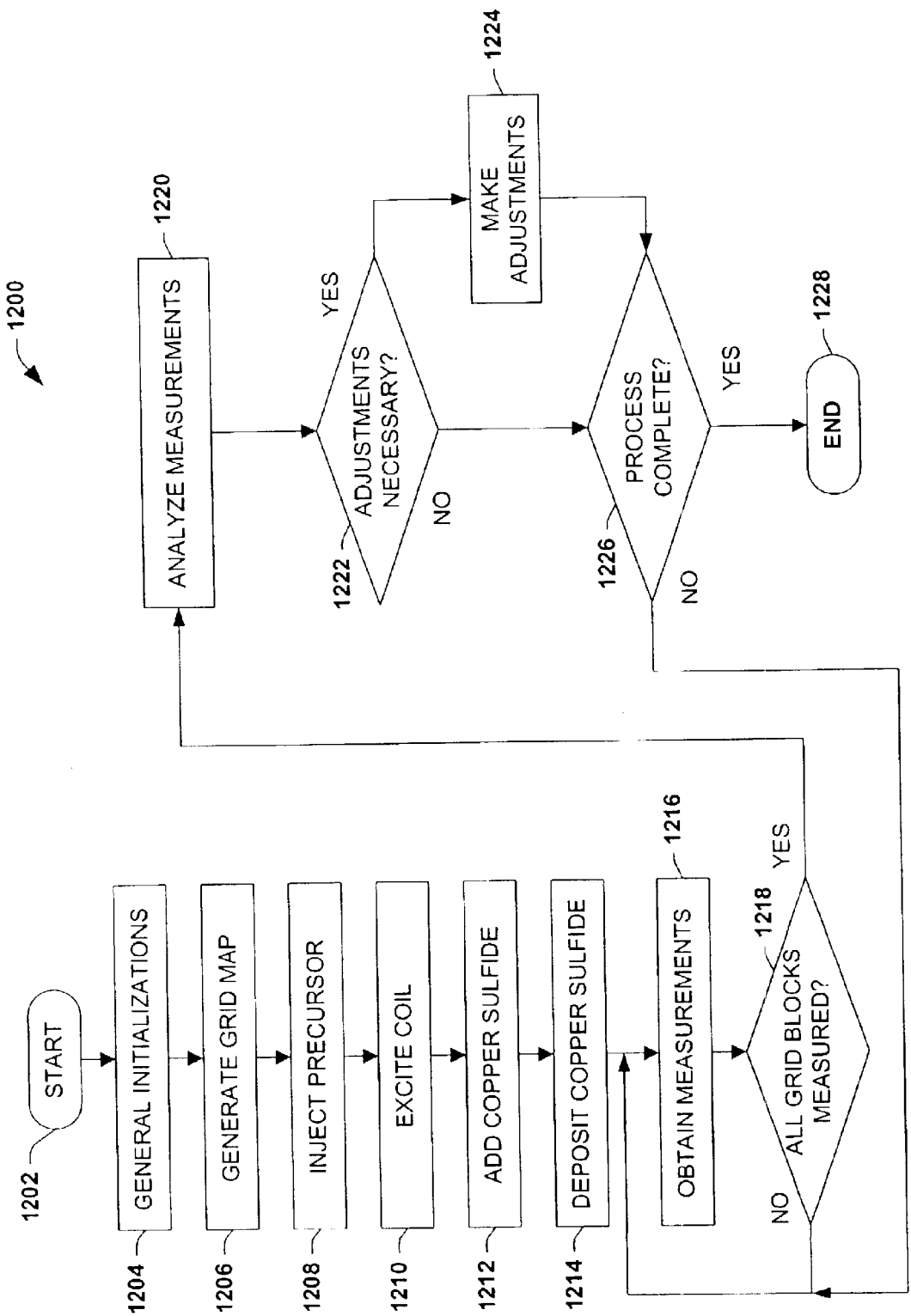
FIG. 12 is a flow diagram illustrating a method for depositing copper sulfide on a conductive layer in the manufacture of one or more memory cells in accordance with one or more aspects of the present invention.

In view of what has been shown and described above, a methodology, which may be implemented in accordance with one or more aspects of the present invention, will be better appreciated with reference to the flow diagram of FIG. 12. While, for purposes of simplicity of explanation, the methodology is shown and described as a series of function blocks, it is to be understood and appreciated that the present invention is not limited by the order of the blocks, as some blocks may, in accordance with the present invention, occur in different orders and/or concurrently with other blocks from that shown and described herein. Moreover, not all illustrated blocks may be required to implement a methodology in accordance with one or more aspects of the present invention. It is to be appreciated that the various blocks may be implemented via software, hardware a combination thereof or any other suitable means (e.g., device, system, process, component) for carrying out the functionality associated with the blocks. It is also to be appreciated that the blocks are merely to illustrate certain aspects of the present invention in a simplified form and that these aspects may be illustrated via a lesser and/or greater number of blocks.

Turning to FIG. 12, a flow diagram illustrates a methodology 1200 for depositing conductivity facilitating material, such as copper sulfide ($Cu_2S$, CuS), onto a layer of conductive material (e.g., copper) on a wafer in accordance with one or more aspects of the present invention. The deposition can be part of a process for forming one or more memory cells on the wafer via plasma enhanced chemical vapor deposition (PECVD) utilizing a metal organic gas precursor in a deposition chamber. After startup at 1202, general initializations are performed at 1204. Such initializations can include, but are not limited to, establishing pointers, allocating memory, setting variables, establishing communication channels and/or instantiating one or more objects.

At 1206, a grid map comprising one or more grid blocks "XY" is generated on the wafer which is located within the chamber. Such grid blocks may correspond to locations on the wafer where one or more memory cells can be formed, for example. Then, at 1208, a metal organic gas precursor is injected into the chemical vapor deposition (CVD) chamber. The gas precursor can include, for example, chelate Cu (II) diethyldithiocarbamate or $CU(S_2CN(C_2H_5)_2)_2$ (II). This precursor mitigates the need for highly toxic hydrogen sulfide ($H_2S$) within the chemical vapor deposition process.

After the gas precursor has been introduced into the chamber, an RF source (e.g., a voltage) excites a coil located within the chamber at 1210. The coil in turn excites the metal organic precursor to form a plasma within the chamber that assists with the deposition process. At 1212, a gaseous form of conductivity facilitating material, such as copper sulfide, is introduced into the chamber. A gaseous form of helium can also be added to the chamber along with the copper sulfide to serve as a carrier gas. At 1214, the RF plasma activates the deposition process and the conductivity facilitating copper sulfide is deposited onto the conductive layer of the wafer.

At 1216, as the plasma enhanced chemical vapor deposition process progresses, measurements are taken at the grid mapped locations with one or more non-destructive measurement techniques, such as may include, for example, optical interference, scatterometry, IR spectroscopy, ellipsometry, scanning electron microscopy, synchrotron and/or x-ray diffraction. For example, the thickness of deposited copper sulfide can be monitored at the respective grid mapped locations. At 1218, a determination is made as to whether measurements have been taken at all (or a sufficient number) of grid mapped locations. If the determination at 1218 is NO, then the methodology returns to 1216 so that additional measurements can be made. At 1220, the measurements are analyzed (e.g., via a comparison of signatures generated from the measurements to stored signature values). For example, measurements of copper sulfide thickness can be compared to acceptable values to determine if the fabrication process is progressing as planned. Measured values can, for example, can be compared to acceptable values to determine if, for instance, the conductivity facilitating material is being deposited too quickly, too slowly, and/or at appropriate locations.

At 1222, a determination is made as to whether the analysis yields an indication that the process should be adjusted (e.g., an undesired value ($V_U$) is encountered). If the determination at 1222 is NO, indicating that no adjustments are necessary, then the methodology proceeds to 1226 where a determination is made as to whether the process is over (e.g., has copper sulfide been formed to a desired thickness, concentration, density, etc.). If the determination at 1226 is NO, then the methodology returns to 1216 to take additional measurements while processing continues. If the determination at 1226 is YES, indicating that processing is over, then the methodology advances to 1228 and ends. If, at 1222, the determination is YES, indicating that adjustments are necessary, then at 1224, one or more fabrications components and/or operating parameters associated therewith can be selectively adjusted as described herein to adapt the process accordingly. For example, if copper sulfide is accumulating too quickly, sophisticated modeling techniques can be employed to determine which of one or more vent valves that allow gaseous copper sulfide into the chamber should be closed for respective periods of time and/or should be allowed to remain open, but to lesser degrees. After adjustments have been made at 1224, the methodology proceeds to 1226 to see if the process is over. As mentioned above, events can occur in orders different from that depicted in FIG. 12. For example, measurements taken, as at 1216, can be analyzed, as at 1220, prior to determining whether measurements have been taken at all grid mapped locations, as at 1218.

It will be appreciated that a conductivity facilitating layer (e.g., CuS) employed in polymer memory cells plays an important role. Its presence significantly improves the conductivity of the organic layer. This characteristic is at least partially a function of the following: charge carrier generated by CuS, build up of a charge depletion layer, charge carrier distribution, and memory loss due to charge carrier redistribution after reversing electric field. The discussion infra describes and illustrates charge carrier concentration and behavior.

In the following example, a conductive polymer is implemented, and CuS is utilized a conductivity facilitating material. With respect to charge carrier generation, the copper in CuS is at its highest oxidation state Cu(II). It has relatively strong capability to gain electrons from a contacting polymer and yields the following equation:

$$Cu(II)S + Polymer \rightarrow Cu(I)S^- + Polymer^+ \tag{1}$$

Figure 13:
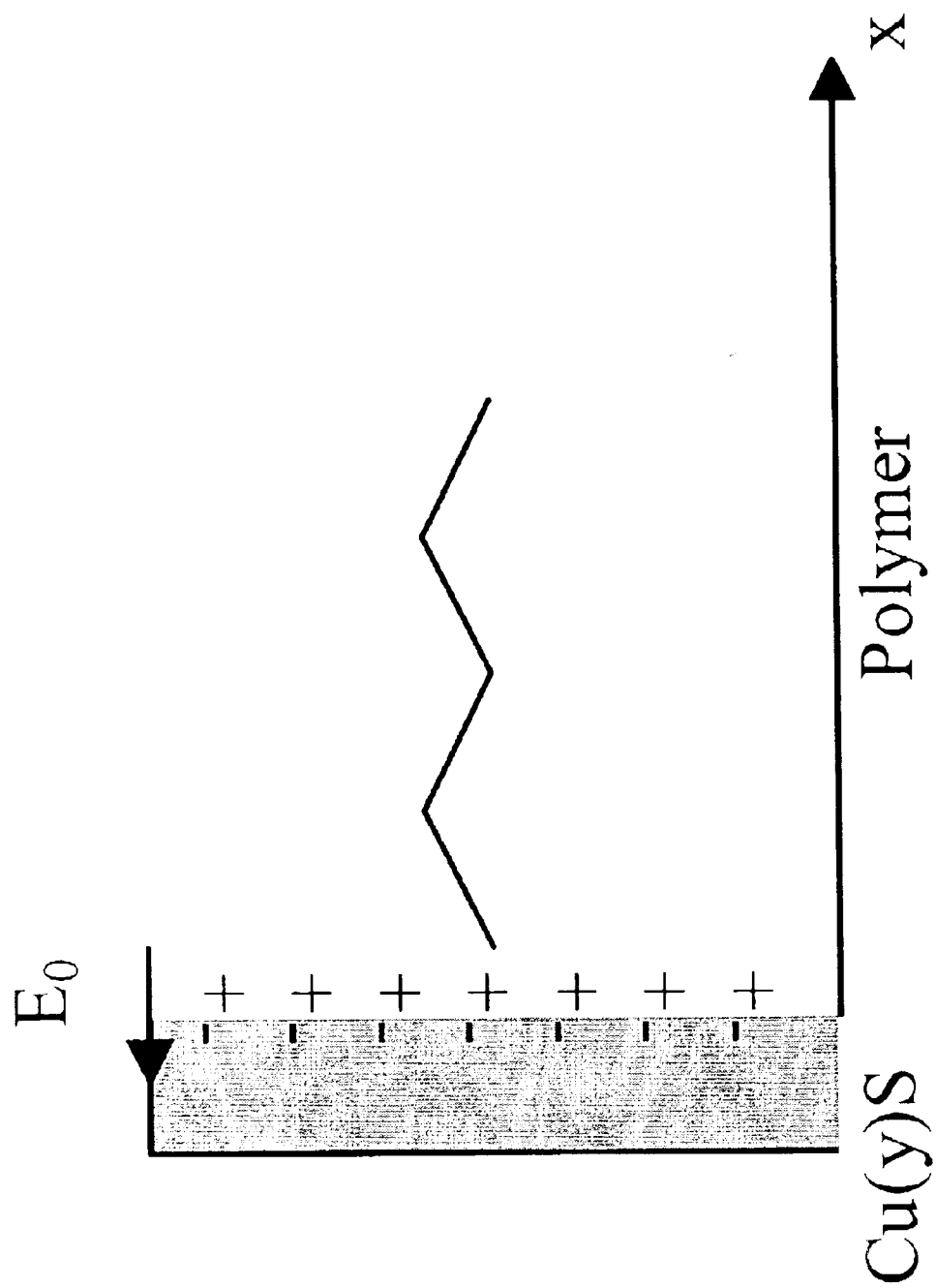
FIG. 13 is a graph depicting the effect of an intrinsic electric field on an interface between a conductivity facilitating layer and a polymer layer in accordance with one or more aspects of the present invention.

The consequence is that an intrinsic field is produced due to the charges accumulated on the interface between CuS and polymer. This is shown in FIG. 13, which is a graph depicting the effect of an intrinsic electric field on an interface between Cu(y)S and a polymer is provided. The oxidized polymer (Polymer$^+$) is the charge carrier when external field is applied. The conductivity of polymer is determined by its concentration and its mobility.

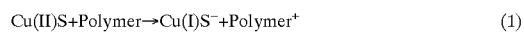

$$\sigma = qp\mu \tag{2}$$

Where q is the charge of the carrier, p is carrier concentration and $\mu$ is the mobility.

Referring now to the charge depletion layer, employing a similar concept as applied with respect to semiconductors, a potential function can be expressed as:

$$V(x) = qN_p(d_p x - x^2/2)/\epsilon \qquad (3)$$

where $N_p$ is the average concentration of charge carrier, r is the dielectric constant of the polymer, and $d_p$ is the width of the charge depletion. $N_p$ can be obtained by employing the following equation:

$$d_p = \left[\frac{2\epsilon(V_b \pm V)}{qN_p}\right]^{1/2} \qquad (4)$$

where V is the external field voltage applied. For forward voltage, it is "−" sign. For the reverse voltage, it is "+" sign. The voltage function of Eq. (3) can be approximated to simplify the derivation.

With respect to charge carrier distribution, like p-doping of a semiconductor, two processes typically take place in the electric field. This flux can be expressed as:

$$J = -qD\frac{dp}{dx} + q\mu pE \qquad (5)$$

where D is diffusion constant of the charge carrier, and E is the electric field at x. If there is no current, the carrier distribution is:

$$p(x) = p(0)\exp([(V(0) - V(x))/Vt]) \qquad (6)$$

where p(0) is the concentration, V(0) is voltage at the interface respectively, and $V_t = kT/q$.

When forward voltage is so large that the current flux J>0, the analytical equation can be derived for steady state flow with some assumption for the voltage distribution in the cell. Overall, under forward voltage, the charge distribution p(x) is an increase function of x. When reverse voltage is applied, $V(x) > V_0$, the charge concentration is a decrease function of x.

The final characteristic, retention time, refers to the fact that a forward voltage produces more charge carrier and the charge carrier accumulates more on the other end of the passive (CuS) layer (away from the polymer). However, this charge carrier concentration will be set back once the voltage is removed, which includes two processes: charge carrier diffusion toward the CuS layer and charge carrier recombination on the interface.

Fick's Law can describe the 1st process, charge carrier diffusion toward the CuS layer.

The charge carrier recombination can be described as follows:

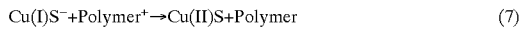

$$Cu(I)S^- + Polymer^+ \rightarrow Cu(II)S + Polymer \qquad (7)$$

The retention time is the time required to redistribute the charge carrier to the original state. It is likely that the reaction rate is relatively faster than diffusion rate. Therefore, the retention time can be substantially determined by the diffusion process only.

An exemplary memory cell is considered herein with respect to the equations 1–9 discussed supra and illustrated in FIGS. 14–19. The exemplary cell is considered with parameters intrinsic voltage $V_b = 0.02V$, equilibrium constant $K_{eq} = 2.17 \times 10^{-4}$, concentration of CuS and Polymer at interface $[Polymer]_0 = [CuS]_0 = 10^{23}/Cm^3$, polymer thickness $d = 5 \times 10^{-5}$ cm (0.5 um), and CuS thickness $d_{CuS} = 5 \times 10^{-7}$ cm (0.005 um). Six typical cases are calculated to illustrate electrical operation of an organic memory cell in accordance with an aspect of the present invention.

Figure 14:
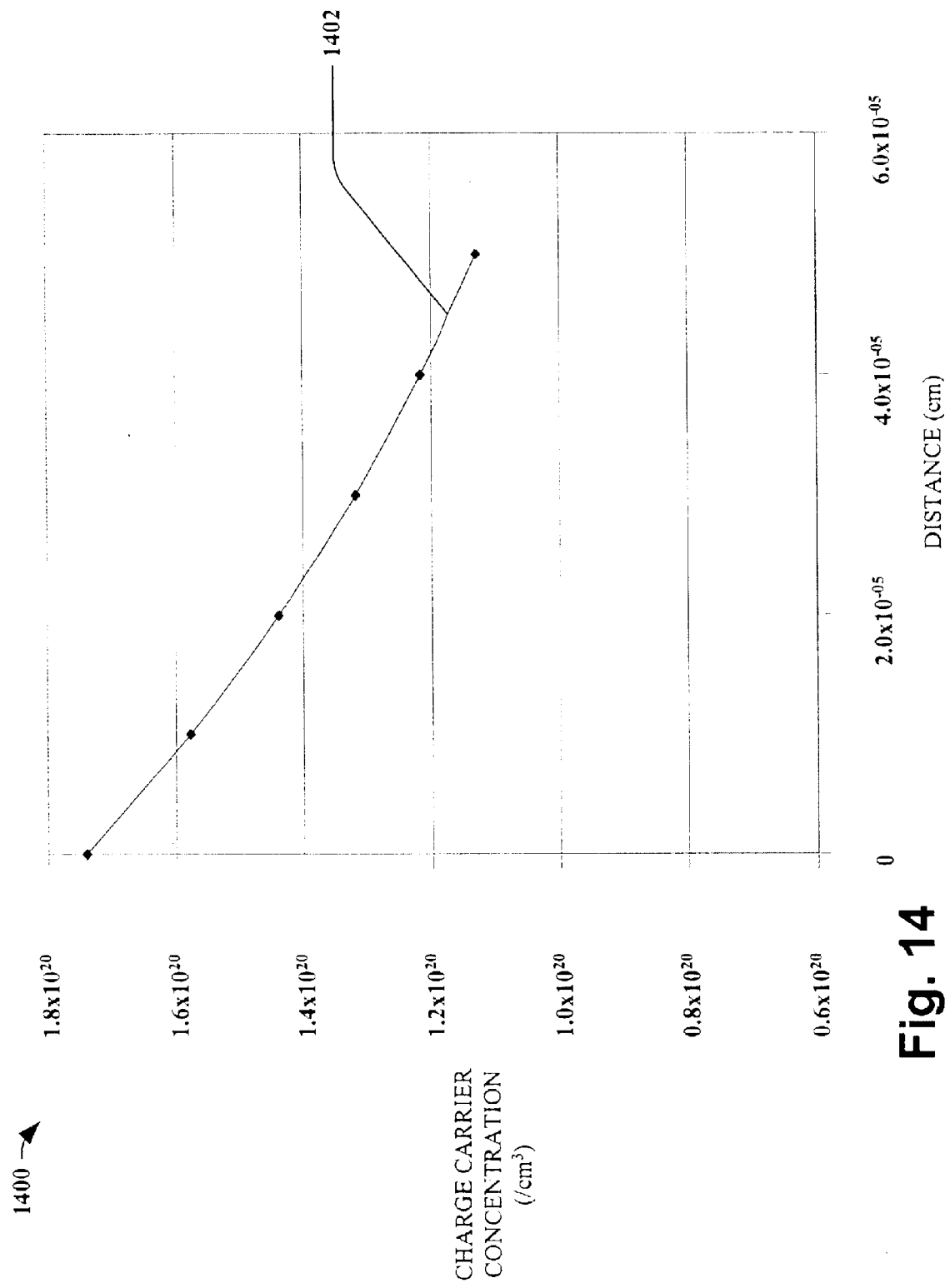
FIG. 14 is graph illustrating charge carrier distribution of an exemplary memory cell in accordance with one or more aspects of the present invention.

FIG. 14 depicts a graph 1400 of charge carrier distribution 1402 of the exemplary memory cell as a function of distance from the CuS and organic polymer interface in accordance with an aspect of the invention. The charge carrier concentration 7102 is shown as being a decreasing function of distance (x) from the interface. This graph 1400 assumes an external voltage V=0 and a current J=0. The charge carrier concentration 1402 is derived utilizing Eq. 6 with a constant field assumption. However, the points shown are independent of the constant field assumption.

Figure 15:
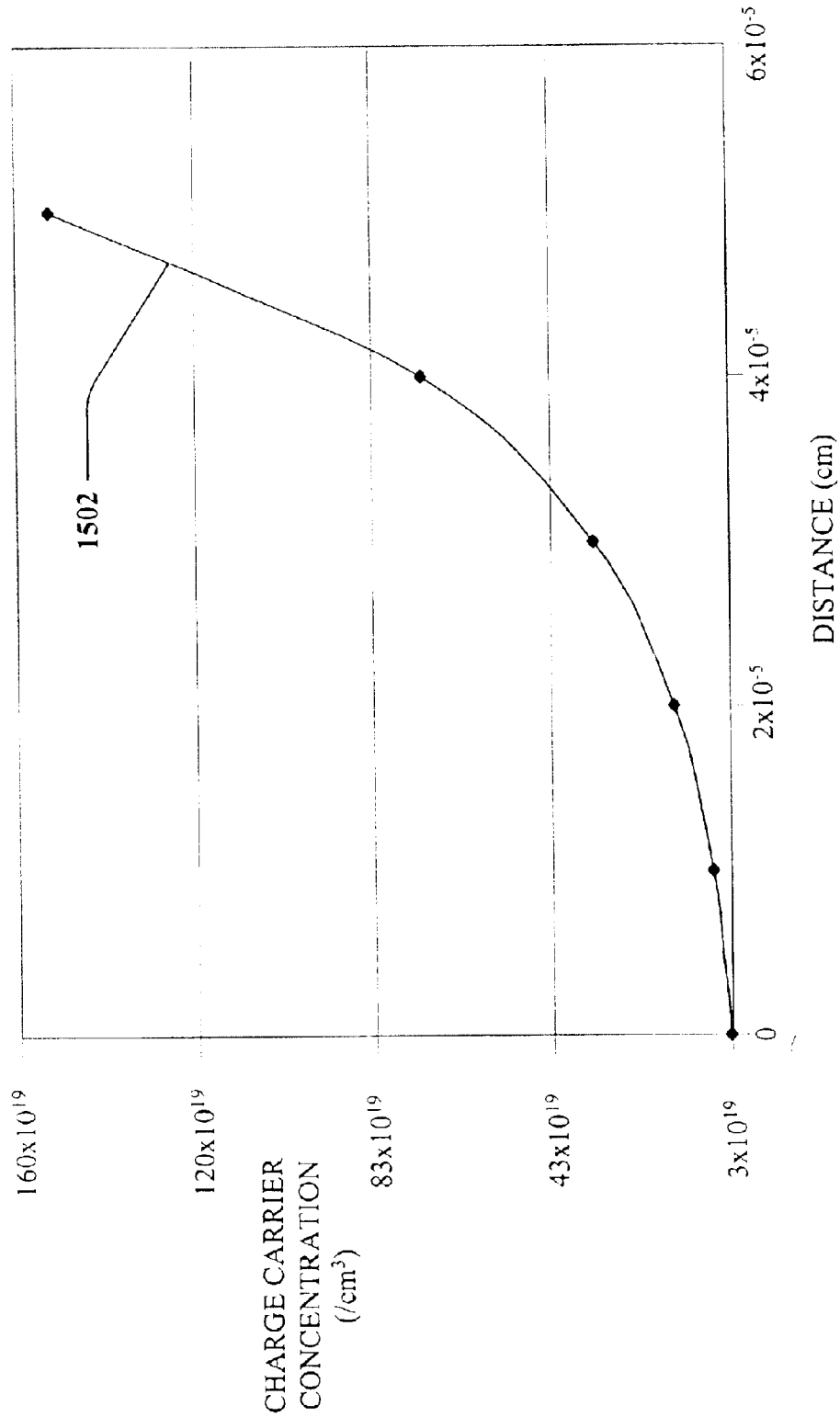
FIG. 15 is another graph illustrating charge carrier distribution of an exemplary memory cell in accordance with one or more aspects of the present invention.

Turning now to FIG. 15, another graph 1500 illustrating charge carrier distribution 1502 for the exemplary organic memory cell is depicted in accordance with an aspect of the present invention. For this graph 1500, parameters are set as follows: forward voltage=0.12V and current flux J=0. The CuS end has a higher voltage than the other end (organic polymer). This drives the charge carrier away from CuS layer and leads to charge carrier concentration that has an increase function of x. Even at lowest concentration p(0), it is not a small value for this case (e.g., its value is 3.32× $10^{19}/Cm^3$ for the case shown in FIG. 15). This explains why the polymer is a good conductor when forward voltage is applied. Again, it is Eq. 6 with constant electric field model used for the plot. The points demonstrated are independent of constant electric field assumption.

Figure 16:
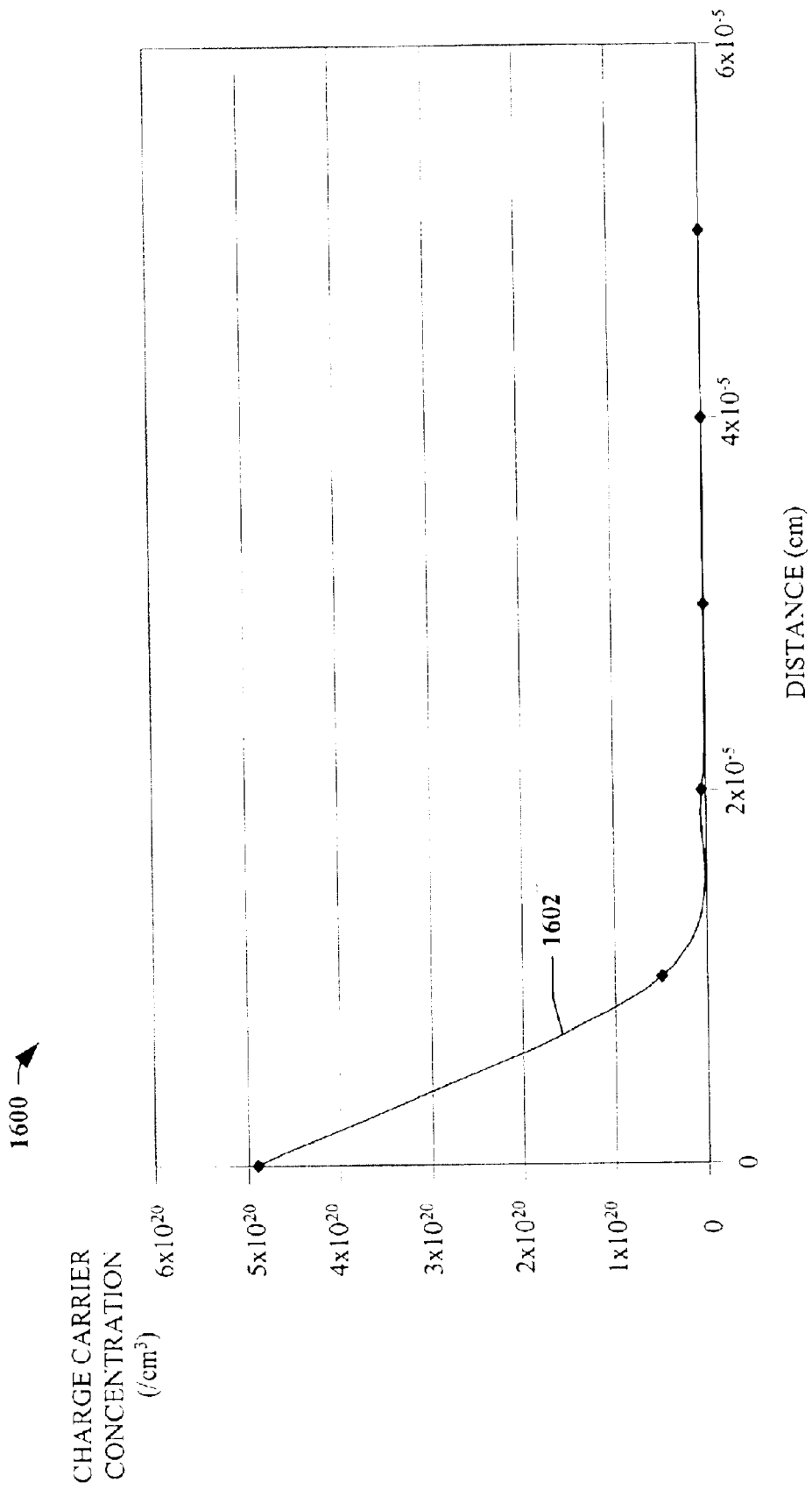
FIG. 16 depicts yet another graph illustrating charge carrier distribution of an exemplary memory cell in accordance with one or more aspects of the present invention.

FIG. 16 depicts yet another graph 1600 of charge carrier distribution 1602 of the exemplary memory cell as a function of distance from the CuS and organic polymer interface in accordance with an aspect of the invention. For this graph, the parameters are set such that the reverse voltage=0.28V and the current J=0. With reversed voltage, the charge carrier is concentrated at the CuS polymer interface and drops quickly to small concentration when it is away from the interface, which describes why the memory cell becomes non-conductive when high reversed voltage applied. Again, Eq. 6 with constant electric field model is assumed for the plot. The points demonstrated are independent of this assumption.

Figure 17:
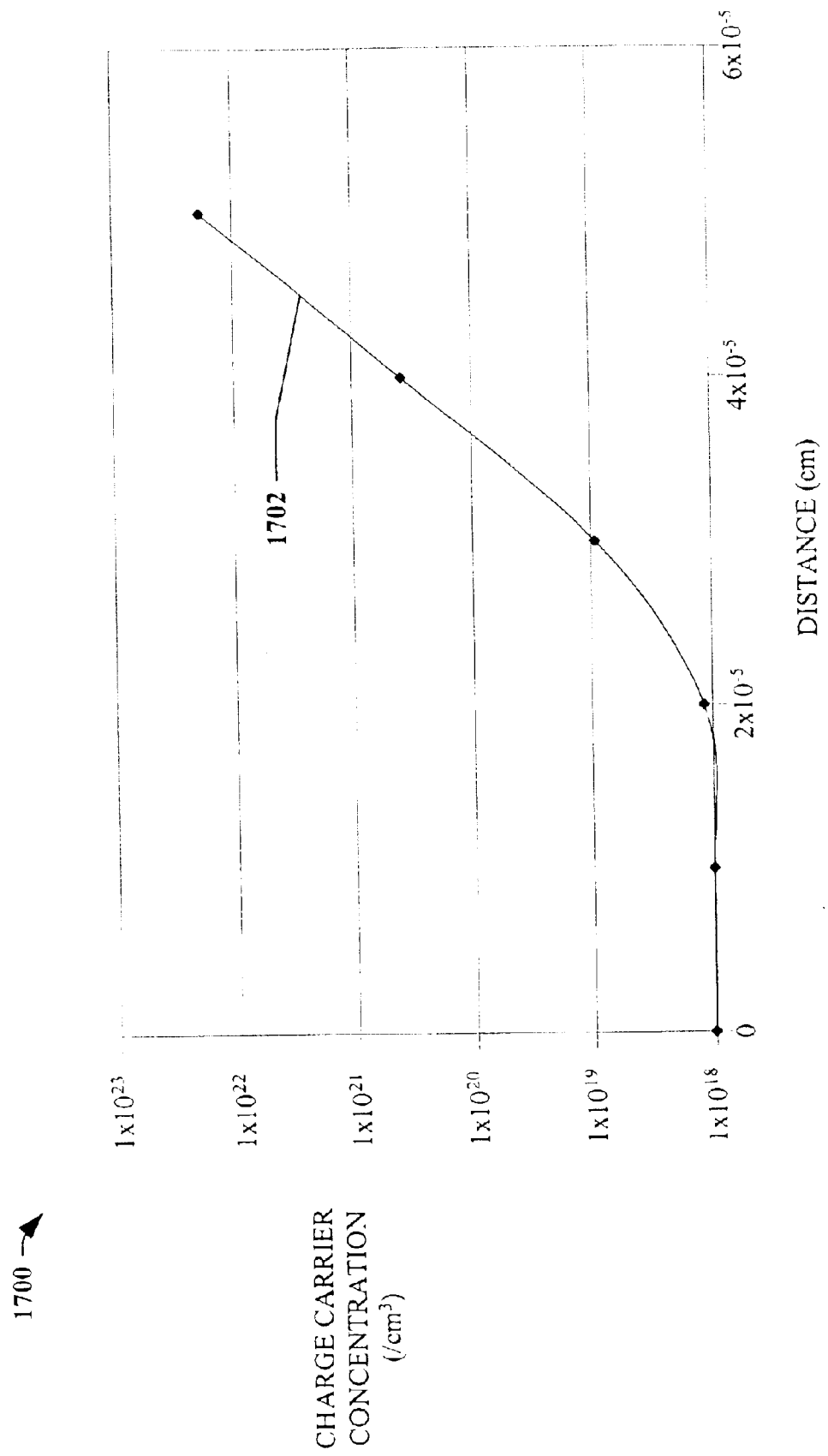
FIG. 17 is yet another graph illustrating charge carrier distribution of an exemplary memory cell in accordance with one or more aspects of the present invention.

Referring now to FIG. 17, another graph 1700 that depicts charge carrier distribution 1702 of the exemplary memory cell as a function of distance in accordance with an aspect of the present invention is provided. For this graph 1700, parameters are set as follows: forward voltage=0.52V and current flux J>0 ($p_j = 10^{18}/cm^3$). When current flux J>0, the charge carrier is still an increase function of x because the forward voltage drives the charge carrier away from CuS interface. One important point is that the lowest concentration p(x) is at interface.

Figure 18:
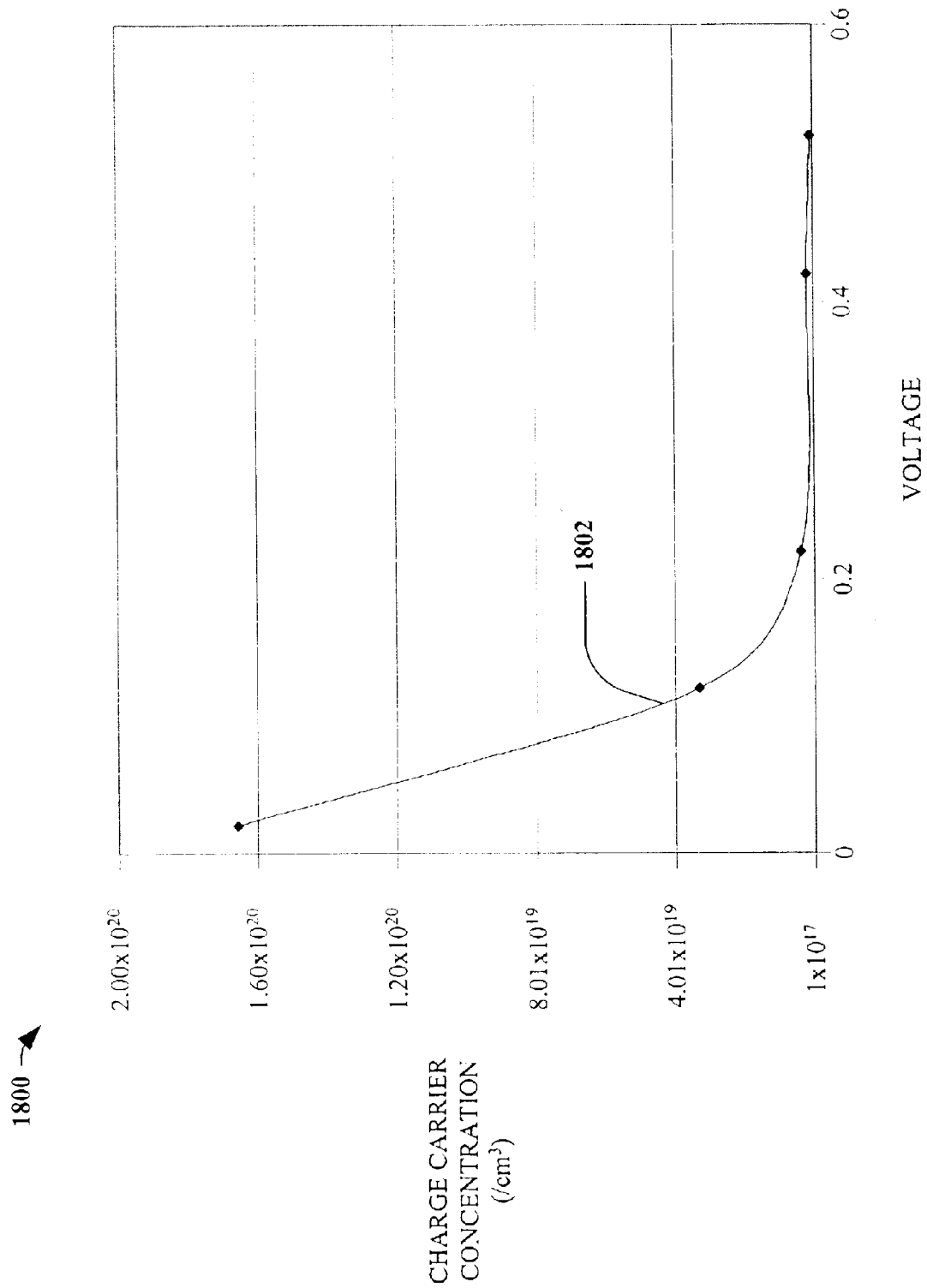
FIG. 18 is a graph illustrating charge carrier concentration at the interface of an exemplary memory cell in accordance with one or more aspects of the present invention.

FIG. 18 depicts yet another graph 1800 of charge carrier concentration at interface 2102 of the exemplary memory cell as function of forward voltage V. For this graph, the parameters are set such that J>0 ($p_j = 10^{18}/cm^3$) and assumes a constant electric field model. This model assumes the electric field in the cell is constant. Therefore, the voltage V(x) is described as a linear function. This model is applicable when the diffusion constant of the polymer is small and there is constant electric resistance. With this model, the charge carrier concentration at interface is derived as function of voltage. It is noted that $p_0(V)$ tends to be constant after forward voltage is large enough and the current is controlled by the charge carrier not charge injection at the interface. As such, p(0) can be rewritten as:

$$p(0) = \frac{1}{2}\left\{-K_{eq}[\text{Polymer}]_0 + \sqrt{(K_{eq}[\text{Polymer}]_0)^2 + \frac{4d_{CuS}K_{eq}[\text{Polymer}]_0[\text{CuS}]_0}{d}}\right\} \quad (10)$$

This Eq. 10 shows that limiting p(0) is an increase function of thickness ratio between CuS layer and polymer layer.

Figure 19:
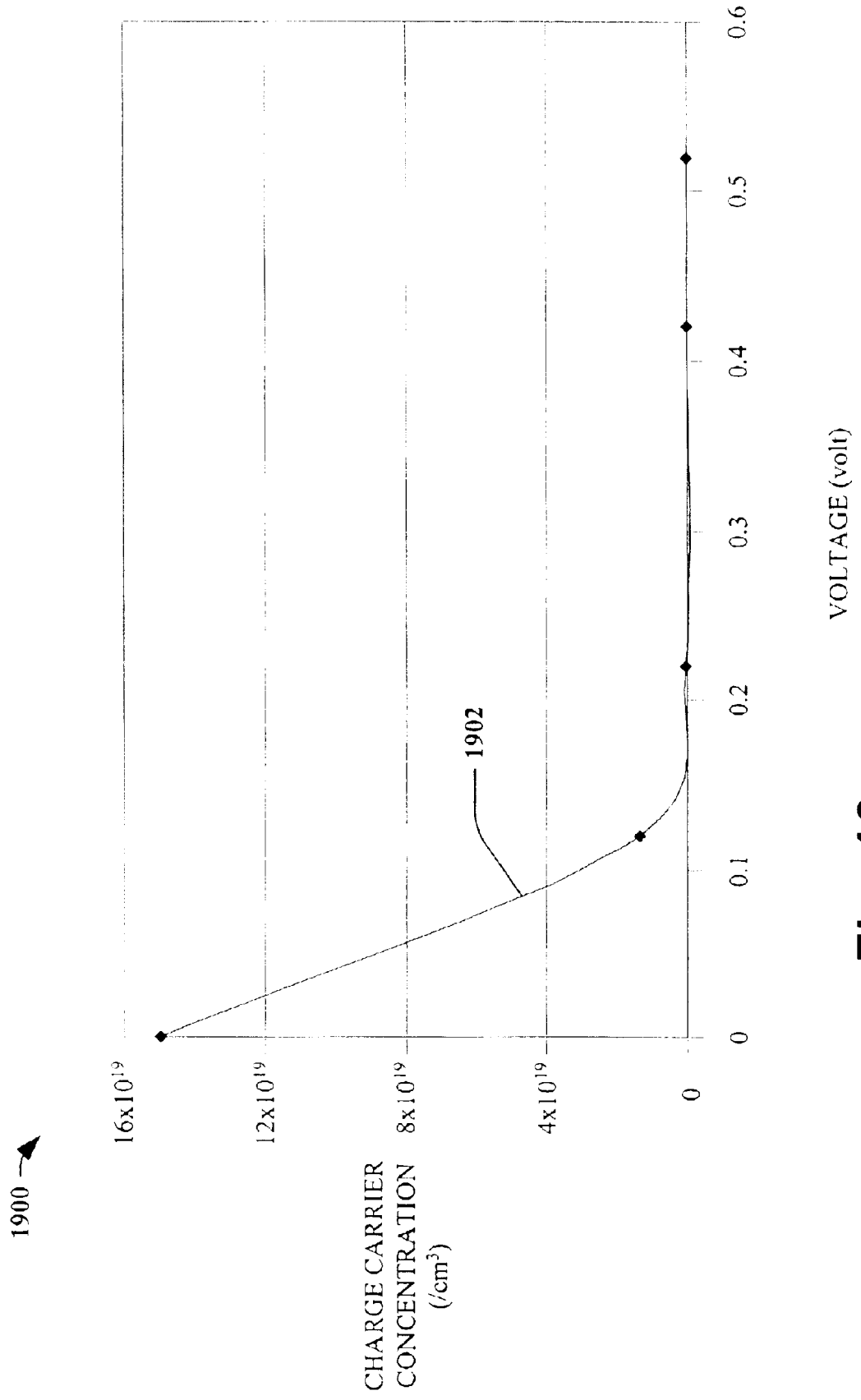
FIG. 19 is another graph illustrating charge carrier concentration at the interface of an exemplary memory cell in accordance with one or more aspects of the present invention.

FIG. 19 illustrates another graph 1900 that depicts charge carrier concentration at the interface 1902 of the exemplary memory cell as function of forward voltage Vin accordance with an aspect of the present invention is provided. For this graph $^{1900}$, p(0) is a function of forward voltage, current J, which may or may not be>0, and a step potential function model. This model assumes the voltage V(x) function can be described by a step function. The model is applicable when the diffusion constant of the polymer is very large. Therefore, the electric resistance in the cell is trivial. With this model, the charge carrier concentration at interface is derived as the function of voltage. It is noted that in FIG. 19 that $p_0(V)$ tends to be zero after forward voltage is large enough. When the charge carrier at the interface controls the current flux, this value is a function of voltage. This zero limit behavior is due to the interface boundary limit set by the reaction (1). Basically, the fast charge carrier transportation from the interface to the other end reaches the supply limit. Thus, the limiting p(0) is also rewritten as:

$$p(0) = \frac{1}{2}\left\{-K_{eq}[\text{Polymer}]_0 + \sqrt{(K_{eq}[\text{Polymer}]_0)^2 + \frac{4d_{CuS}K_{eq}[\text{Polymer}]_0[\text{CuS}]_0}{d\left[\exp\frac{V(0)-V}{V_t} - \frac{V(0)-V}{V_t}\right]}}\right\} \quad (11)$$

Again p(0) is an increase function of thickness ratio between CuS layer and polymer layer.

Regarding the above discussion, it is important to note that the flux measured is determined by charge carrier drift when limiting flux is in the polymer. Under constant electric field assumption, the function to describe the charge carrier concentration is p(x). $p_j=p(0)$ is met when the polymer determines limiting flux since the lowest concentration in the cell is at the interface. This condition results in a constant p(x). This means the diffusion contribution to the flux in Eq. 5 is zero. Under step potential assumption, another function is employed to describe the charge carrier concentration p(x). The initial charge carrier concentration p(0) has a relatively substantially smaller value than other regions. Therefore, J is still determined by p(0). Another point that is noted regards boundary conditions. Unlike semiconductors, it is just applicable to the concentration at interface, not everywhere. This boundary condition limits the total amount of the charge carrier produced in the cell.

The equations supra (E.q. 1–7) and the FIGS. 16–19 describe and model behavior of polymer memory cells. This model can be employed to explain measured data and can be for other materials aside from CuS. Additionally, the model can be used to think about how to improve retention and response time and to design the other devices such as transistors. Further, the model can be employed to develop various threshold voltages that set conductivity levels (e.g., set states), read conductivity levels and erase the conductivity levels thus performing memory cell operations of writing or programming, reading and erasing.

What has been described above are one or more aspects of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims. In addition, while a particular feature of the invention may have been disclosed with respect to only one of several implementations, such feature may be combined with one or more other features of the other implementations as may be desired and advantageous for any given or particular application. Furthermore, to the extent that the term "includes" is used in either the detailed description and the claims, such term is intended to be inclusive in a manner similar to the term "comprising."

What is claimed is:

1. A system for forming a conductivity facilitating compound on a conductive layer in the manufacture of one or more memory cells comprising:
   a gas distribution system that selectively provides a gaseous form of a metal organic precursor and a gaseous form of the conductivity facilitating compound into a deposition chamber; and
   an excitation system that electrically excites the precursor establishing an rf plasma in the chamber to activate deposition of the conductivity facilitating compound onto the conductive layer.

2. The system of claim 1 wherein the deposition occurs under a pressure of between about 0.05 to 0.5 Pa.

3. The system of claim 2 wherein the deposition occurs at a temperature of between about 400 to 600 K.

4. The system of claim 1 wherein the conductivity facilitating compound includes copper sulfide and is deposited to a thickness between about 200 to 600 nm.

5. The system of claim 1 wherein the conductivity facilitating compound includes copper sulfide and has a refractive index from about 2.0 to 2.21.

6. The system of claim 1 wherein the conductivity facilitating compound includes copper sulfide and has a resistivity of about $5.7 \times 10^{-2}$ Ohm/cm.

7. The system of claim 1 wherein the conductivity facilitating compound includes copper sulfide and is transparent with a transmittance of about 60% between 600 and 700 nm.

8. The system of claim 1 wherein the metal organic gas precursor includes at least one of chelate Cu (II) diethyldithiocarbamate and $Cu(S_2CN(C_2H_5)_2)_2$ (II).

9. The system of claim 1 further comprising:
   a temperature system that regulates the temperature within the chamber.

10. The system of claim 1 further comprising:
    a pressure system that regulates the pressure within the chamber.

11. The system of claim 1 further comprising:
    a measurement system that monitors the conductivity facilitating compound being deposited;
    a temperature system that regulates the temperature within the chamber;
    a pressure system that regulates the pressure within the chamber;
    a control system operatively coupled to at least one of the measurement system, gas distribution system, excitation system, temperature system and pressure system, the control system obtaining readings taken by the measurement and selectively adjusting at least one of the gas distribution system, excitation system, temperature system and pressure system in response thereto to facilitate at least one of depositing the conductivity facilitating compound to a desired thickness, depositing the conductivity facilitating compound at a desired rate, depositing the conductivity facilitating compound to a desired composition, depositing the conductivity facilitating compound to a desired density and depositing the conductivity facilitating compound at a desired location.

12. The system of claim 11 wherein the measurement system is implemented utilizing at least one of optical interference, scatterometry, IR spectroscopy, ellipsometry, scanning electron microscopy, synchrotron and x-ray diffraction based techniques.

13. The system of claim 1 wherein the conductivity facilitating compound deposition occurs in the absence of hydrogen sulfide.

14. The system of claim 1 wherein the gas distribution system further selectively provides a gaseous form of helium into the chamber along with the conductivity facilitating compound to serve as a carrier gas.

15. The system of claim 1 wherein the conductive layer includes at least one of copper, aluminum, chromium, germanium, gold, magnesium, manganese, indium, iron, nickel, palladium, platinum, silver, titanium, zinc, alloys thereof, indium-tin oxide, polysilicon, doped amorphous silicon, metal silicides, Hastelloy®, Kovar®, Invar, Monel®, Inconel®, brass, stainless steel and magnesium-silver alloy.

16. The system of claim 1 wherein the conductive layer is adjacent to a dielectric material that includes at least one of silicon oxide (SiO), silicon dioxide ($SiO_2$), silicon nitride ($Si_3N_4$), (SiN), silicon oxynitride ($SiO_xN_y$), fluorinated silicon oxide ($SiO_xF_y$), polysilicon, amorphous silicon, tetraethyorthosilicate (TEOS), phosphosilicate glass (PSG) and borophosphosilicate glass (BPSG).

* * * * *